US012757444B2

(12) United States Patent
Xie et al.

(10) Patent No.: US 12,757,444 B2
(45) Date of Patent: Oct. 6, 2026

(54) BACKSIDE POWER DISTRIBUTION NETWORK AND SIGNAL LINE INTEGRATION

(71) Applicant: International Business Machines Corporation, Armonk, NY (US)

(72) Inventors: Ruilong Xie, Niskayuna, NY (US); Lawrence A. Clevenger, Saratoga Springs, NY (US); Brent A. Anderson, Jericho, VT (US); Kisik Choi, Watervliet, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 576 days.

(21) Appl. No.: 17/890,000

(22) Filed: Aug. 17, 2022

(65) Prior Publication Data

US 2024/0063283 A1 Feb. 22, 2024

(51) Int. Cl.
*H10D 30/67* (2025.01)
*H10D 62/13* (2025.01)
(Continued)

(52) U.S. Cl.
CPC ....... *H10D 30/6735* (2025.01); *H10D 62/151* (2025.01); *H10D 84/017* (2025.01);
(Continued)

(58) Field of Classification Search
CPC ............. H10D 30/6735; H10D 62/151; H10D 84/017; H10D 84/038; H10D 84/853; H10D 84/0153; H10D 30/6757; H10D 62/121; H10D 84/85; H10D 84/0186; H10W 20/057; H10W 20/20; H10W 20/023;
(Continued)

(56) References Cited

U.S. PATENT DOCUMENTS 3,962,052 A 6/1976 Abbas et al.
5,811,868 A 9/1998 Bertin et al.
(Continued)

OTHER PUBLICATIONS

Natarajan et al., "How PowerVia and RibbonFET Shape the Future of Silicon Design . . . Part II of II" Intel Tech Oct. 2021 (6 pages).
(Continued)

*Primary Examiner* — Julia Slutsker
(74) *Attorney, Agent, or Firm* — Samuel A. Waldbaum

(57) ABSTRACT

A backside power distribution network is provided having an integrated signal line with a backside connection to a transistor gate. In one aspect, a semiconductor device includes: NFETs and PFETs adjacent to one another on a frontside of a wafer; power rails, connected to source/drain regions of the NFETs and PFETs, present on a backside of the wafer in a space between adjacent NFETs and in a space between adjacent PFETs; and a signal line, connected to a gate of the NFETs and PFETs, present on the backside of the wafer in a space between an adjacent NFET and PFET. The NFETs and PFETs can each include a stack of active layers, and gates surrounding at least a portion of each of the active layers in a gate-all-around configuration. A method of fabricating the present semiconductor devices is provided.

15 Claims, 43 Drawing Sheets

(51) Int. Cl.

| | |
|---|---|
| ***H10D 84/01*** | (2026.01) |
| ***H10D 84/03*** | (2025.01) |
| ***H10D 84/85*** | (2025.01) |
| ***H10W 20/00*** | (2026.01) |
| ***H10W 20/20*** | (2026.01) |

(52) U.S. Cl.

CPC ......... *H10D 84/038* (2025.01); *H10D 84/853* (2025.01); *H10W 20/057* (2026.01); *H10W 20/20* (2026.01)

(58) Field of Classification Search

CPC ........... H10W 20/0245; H10W 20/427; H10W 20/481; H10W 20/0698

See application file for complete search history.

(56) References Cited

U.S. PATENT DOCUMENTS

| | | | |
|---|---|---|---|
| 5,814,889 | A | 9/1998 | Gaul |
| 5,998,292 | A | 12/1999 | Black et al. |
| 6,198,168 | B1 | 3/2001 | Geusic et al. |
| 7,276,787 | B2 | 10/2007 | Edelstein et al. |
| 7,935,571 | B2 | 5/2011 | Ramiah et al. |
| 8,276,002 | B2 | 9/2012 | Dennard et al. |
| 8,344,512 | B2 | 1/2013 | Knickerbocker |
| 8,445,918 | B2 | 5/2013 | Bartley et al. |
| 9,870,979 | B2 | 1/2018 | Batra et al. |
| 10,586,765 | B2 | 3/2020 | Smith et al. |
| 10,636,739 | B2 | 4/2020 | Beyne et al. |
| 10,797,139 | B2 | 10/2020 | Morrow et al. |
| 10,833,089 | B2 | 11/2020 | Pille et al. |
| 10,985,064 | B2 | 4/2021 | Zhang et al. |
| 11,121,086 | B2 | 9/2021 | Hiblot et al. |
| 2018/0145030 | A1 | 5/2018 | Beyne et al. |
| 2018/0218973 | A1 | 8/2018 | Nelson et al. |
| 2019/0164882 | A1 | 5/2019 | Chen et al. |
| 2019/0326405 | A1 | 10/2019 | Morrow et al. |
| 2020/0105671 | A1 | 4/2020 | Lai et al. |
| 2020/0266169 | A1 | 8/2020 | Kang et al. |
| 2020/0373242 | A1 | 11/2020 | Hiblot et al. |
| 2021/0104435 | A1 | 4/2021 | Son et al. |
| 2021/0111115 | A1 | 4/2021 | Morrow et al. |
| 2021/0118798 | A1 | 4/2021 | Liebmann et al. |
| 2021/0134721 | A1 | 5/2021 | Chiang et al. |
| 2021/0202385 | A1 | 7/2021 | Huang et al. |
| 2021/0202472 | A1 | 7/2021 | Thomson et al. |
| 2021/0296234 | A1 | 9/2021 | Dechene et al. |
| 2021/0343332 | A1 | 11/2021 | Chiu et al. |
| 2021/0358848 | A1 | 11/2021 | Wu et al. |
| 2021/0375761 | A1* | 12/2021 | Chang ................ H10D 84/0167 |
| 2022/0020859 | A1 | 1/2022 | Cho et al. |
| 2022/0077134 | A1 | 3/2022 | Chen et al. |

OTHER PUBLICATIONS

U.S. Appl. No. 17/498,472 by Farooq et al., "Semiconductor Circuit Power Delivery," filed Oct. 11, 2021, (46 total pages).

U.S. Appl. No. 17/479,966 by Frougier et al., "Semiconductor Structures with Power Rail Disposed Under Active Gate," filed Sep. 20, 2021, (76 total pages).

U.S. Appl. No. 17/508,113 by Anderson et al., "Early Backside First Power Delivery Network," filed Oct. 22, 2021, (24 total pages).

U.S. Appl. No. 17/205,037 by Xie et al., "Substrate Thinning for a Backside Power Distribution Network," filed Mar. 18, 2021, (50 total pages).

U.S. Appl. No. 17/481,706 by Xie et al., "Backside Electrical Contacts to Buried Power Rails," filed Sep. 22, 2021, (43 total pages).

* cited by examiner

BACKSIDE POWER DISTRIBUTION NETWORK AND SIGNAL LINE INTEGRATION

BACKGROUND

The present invention relates to backside power distribution network designs, and more particularly, to a backside power distribution network having an integrated signal line with a backside connection to a transistor gate, and techniques for fabrication thereof.

With a traditional semiconductor device architecture, signal and power delivery occur through a network of interconnects built on the frontside of a wafer. However, as device dimensions are scaled, resistance becomes a concern especially for power distribution. Namely, as devices become smaller and smaller, so do the interconnects carrying power to vital components such as transistors. For instance, scaling copper wires causes their resistance to increase exponentially.

While techniques such as the use of alternative interconnect materials can provide an incremental solution to the resistance bottleneck, advanced scaling requires a different approach. One such approach is backside power delivery. As its name implies, back side power delivery moves the power delivery layers (also referred to as a backside power distribution network) of a semiconductor device to the backside of the wafer.

Each transistor in a semiconductor device includes source/drain regions interconnected by a channel, and a gate(s) that regulate current flow through the channel. While current backside power delivery implementations enable source/drain power delivery, a solution does not yet exist for also effectively providing connections to the gates.

Accordingly, improved backside power delivery designs with an integrated backside gate contact would be desirable.

SUMMARY

The present invention provides a backside power distribution network having an integrated signal line with a backside connection to a transistor gate. In one aspect of the invention, a semiconductor device is provided. The semiconductor device includes: n-channel field-effect transistors (NFETs) and p-channel field-effect transistors (PFETs) adjacent to one another on a frontside of a wafer; power rails, connected to source/drain regions of the NFETs and the PFETs, present on a backside of the wafer in a space between adjacent NFETs and in a space between adjacent PFETs; and a signal line, connected to a gate of the NFETs and the PFETs, present on the backside of the wafer in a space between an adjacent NFET and PFET.

In another aspect of the invention, another semiconductor device is provided. The semiconductor device includes: n-channel field-effect transistors (NFETs) and p-channel field-effect transistors (PFETs) adjacent to one another on a frontside of a wafer, wherein the NFETs and the PFETs each includes a stack of active layers interconnecting source/drain regions, and gates surrounding at least a portion of each of the active layers in a gate-all-around configuration; power rails, connected to the source/drain regions, present on a backside of the wafer in a space between adjacent NFETs and in a space between adjacent PFETs; and a signal line, connected to a given one of the gates, present on the backside of the wafer in a space between an adjacent NFET and PFET.

In yet another aspect of the invention, a method of fabricating a semiconductor device is provided. The method includes: forming n-channel field-effect transistors (NFETs) and p-channel field-effect transistors (PFETs) adjacent to one another on a frontside of a wafer, where the forming of the NFETs and the PFETs includes forming a signal line contact concurrently with gates of the NFETs and the PFETs such that the gates and the signal line contact include a same combination of materials; forming power rails, connected to source/drain regions of the NFETs and the PFETs, on a backside of the wafer in a space between adjacent NFETs and in a space between adjacent PFETs; and forming a signal line, connected to one of the gates by the signal line contact, on the backside of the wafer in a space between an adjacent NFET and PFET.

A more complete understanding of the present invention, as well as further features and advantages of the present invention, will be obtained by reference to the following detailed description and drawings.

DETAILED DESCRIPTION

Provided herein are backside power delivery designs and techniques for fabrication thereof where a contact to the semiconductor device gate is made from a backside of the wafer in the space between n-channel field effect transistors (NFETs) and p-channel FET (PFETs) of the semiconductor device (also referred to herein as the "NFET-to-PFET" space). As will be described in detail below, doing so involves metallization of the gate contact during formation of the gate. According to an exemplary embodiment, backside signal lines such as clock signal lines are formed, also in the NFET-to-PFET space, directly contacting the gate contact. In that case, the gate contact serves as a signal line contact to the gate. Thus, the terms 'gate contact' and 'signal line contact' may be used interchangeably herein since they both refer to the conductive structure contacting the gate.

Backside power rails, VDD and VSS, which are connected to the semiconductor device source/drain regions are made from a backside of the wafer in the space between adjacent PFETs (also referred to herein as the "PFET-to-PFET space") and from a backside of the wafer in the space between adjacent NFETs (also referred to herein as the "NFET-to-NFET space"), respectively. In general, VDD refers to the positive supply voltage, and VSS refers to the zero volt or ground voltage. The backside power rails can be connected to the source/drain regions through either backside contacts or, as shown and described below, source/drain region power vias fabricated from the frontside.

Figure 1:
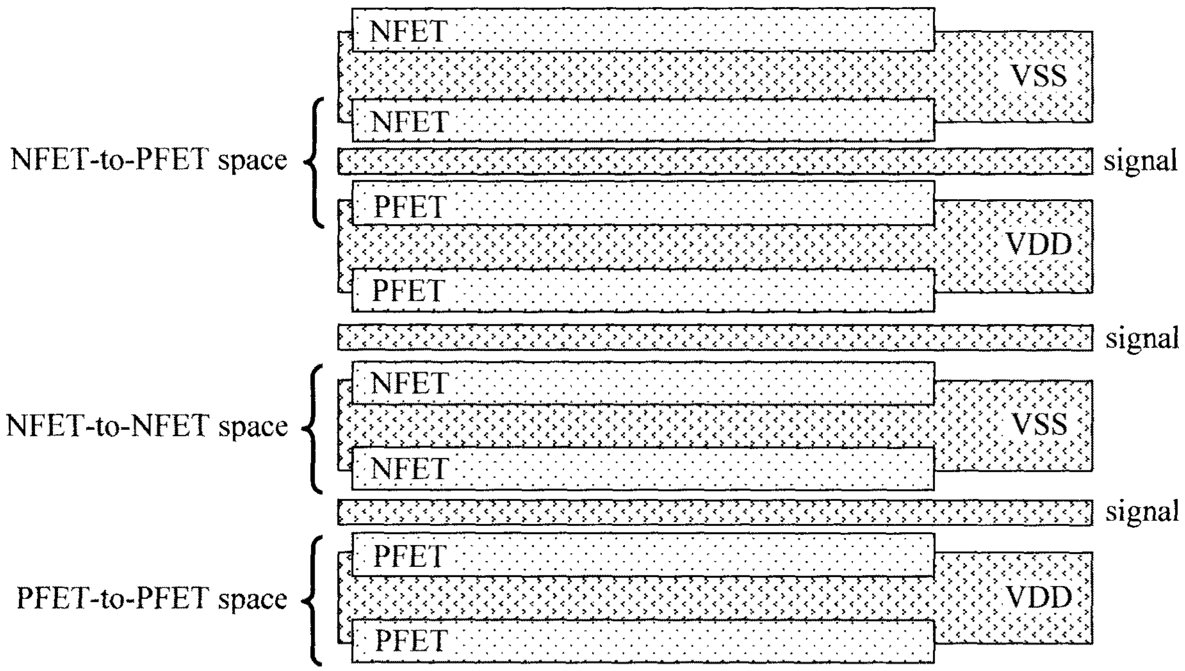
FIG. 1 is a schematic diagram of the overall layout of a backside power delivery design having integrated backside signal lines and power rails according to an embodiment of the present invention.

For instance, referring to FIG. 1, a schematic diagram is shown of the overall layout of a backside power delivery design in accordance with the present techniques. As shown in FIG. 1, the present techniques employ a semiconductor device architecture where individual PFET transistors are formed adjacent to one another, and individual NFET transistors are formed adjacent to one another. Adjacent pairs of PFET transistors are separated by a pair of NFET transistors, and vice versa. The PFET-to-PFET space between adjacent individual PFET transistors is used to place the backside power rails (labeled 'VDD') which can be connected to the source/drain regions through source/drain region power via contacts. The NFET-to-NFET space between adjacent NFET transistors is used to place the backside power rails (labeled 'VSS') which can be connected to the source/drain regions through source/drain region power via contacts. The NFET-to-PFET space between a pair of NFET transistors and an adjacent pair of PFET transistors is used to place the backside signal lines which can be connected to the gate through a backside gate contact. As shown in FIG. 1, the backside power rails VDD and VSS, and the backside signal lines are parallel to one another.

Figure 2:
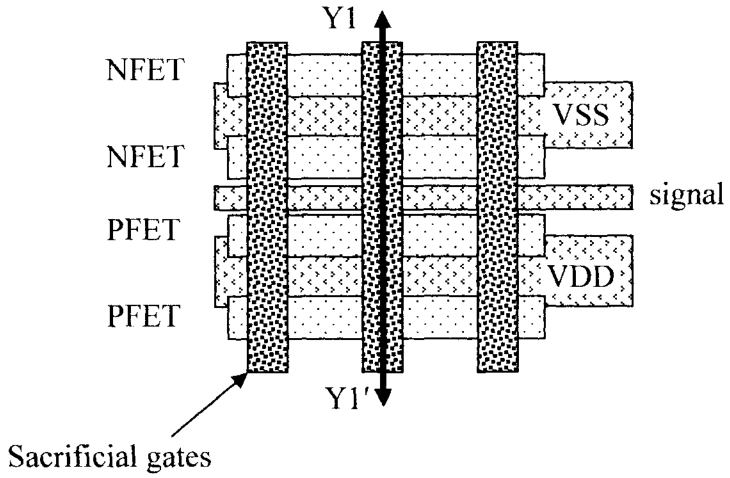
FIG. 2 is a top-down diagram illustrating an orientation of the Y1-Y1' cross-sectional views shown in the figures according to an embodiment of the present invention.

Given the above overview, an exemplary methodology for fabricating the present semiconductor device having backside power delivery with integrated backside signal lines and power rails is now described by way of reference to FIGS. 2-20. Using the same layout from FIG. 1, FIG. 2 is a top-down diagram illustrating an orientation of one of the cross-sectional views that will be illustrated in the figures that follow. As shown in FIG. 2, the present example employs a gate-last approach. With a gate-last approach, sacrificial gates are used as a placeholder during formation of the source/drain regions. The term "sacrificial" as used herein refers to a material or structure that is used in one part of the process, and then later removed, in whole or in part, during fabrication of the semiconductor device. In that manner, the sacrificial gates are removed later on in the process, and replaced with the final gates of the device (also referred to herein as "replacement gates"). When the replacement gates are metal gates, they may also be referred to herein as "replacement metal gates." Advantageously, use of a gate-last process avoids exposing the replacement gate materials such as high-κ dielectrics to potentially damaging conditions such as the high temperatures experienced during source/drain region formation.

The sacrificial gates are oriented orthogonal to the VDD and VSS backside power rails, and to the backside signal line therebetween. See FIG. 2. It is notable that the present example involves the formation of one pair of PFETs adjacent to one pair of NFETs, one VDD backside power rail and one VSS backside power rail in the PFET-to-PFET and NFET-to-NFET spaces, respectively, and one backside signal line in the NFET-to-PFET space. This is done merely for the sake of ease and clarity of depiction. It is to be understood that embodiments are contemplated herein where multiple pairs of PFETs and NFETs are employed along with additional backside power rails and backside signal lines, accordingly.

As shown in FIG. 2, the Y1-Y1' cross-sectional views that will be shown in the figures that follow depict cuts along and through one of the sacrificial gates. Thus, these cuts are perpendicular to the backside power rails and backside signal line.

Figure 3:
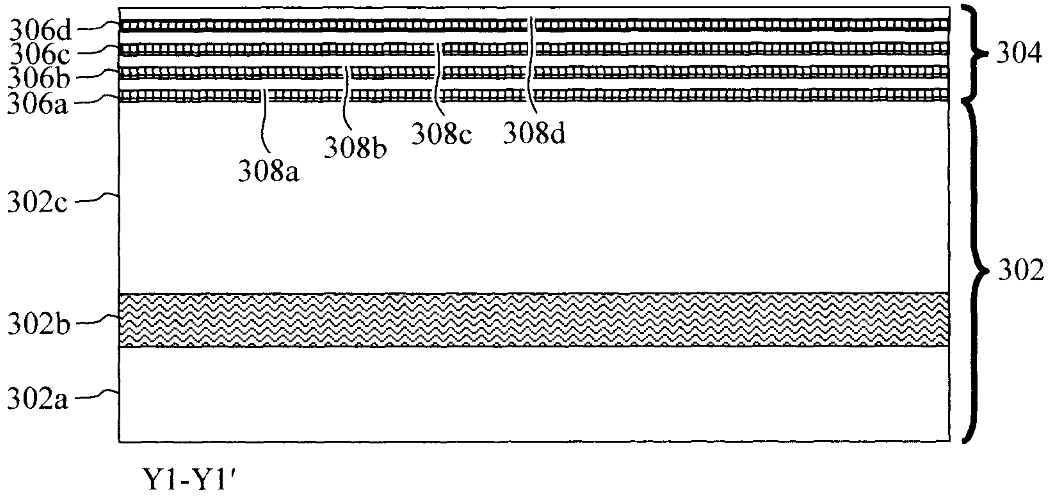
FIG. 3 is a Y1-Y1' cross-sectional view illustrating a stack of sacrificial/active layers having been formed on a wafer, the wafer having a substrate, an etch stop layer disposed on the substrate, and a semiconductor layer disposed on the etch stop layer according to an embodiment of the present invention.

As shown in FIG. 3 (a Y1-Y1' cross-sectional view), the process begins with the formation of a sacrificial/active layer stack 304 on a frontside of a wafer 302. Wafer 302 includes a substrate 302a, an etch stop layer 302b disposed directly on the substrate 302a, and a semiconductor layer 302c disposed directly on the etch stop layer 302b. As will be described in detail below, etch stop layer 302b will be used during removal of the substrate 302a from a backside of the wafer 302. By way of example only, etch stop layer 302b can have a thickness of from about 2 nanometers (nm) to about 50 nm. According to one exemplary embodiment, substrate 302a is a bulk semiconductor wafer, such as a bulk silicon (Si) wafer, and etch stop layer 302b is formed from silicon germanium (SiGe) that is epitaxially grown from the (Si) substrate 302a. In turn, semiconductor layer 302c (e.g., Si) can be epitaxially grown from the etch stop layer 302b.

According to another exemplary embodiment, etch stop layer 302b is an oxide layer. In that case, wafer 302 can be a semiconductor-on-insulator or SOI wafer. An SOI wafer includes an SOI layer separated from an underlying substrate by a buried insulator. When the buried insulator is an oxide, it is also referred to herein as a buried oxide or BOX. In the present example, the substrate, BOX, and SOI layer correspond to the substrate 302*a*, the (oxide) etch stop layer 302*b*, and the semiconductor layer 302*c*, respectively. As above, the SOI layer/semiconductor layer 302*c* can include any suitable semiconductor material(s), such as Si.

Stack 304 includes alternating sacrificial and active layers oriented horizontally one on top of another on wafer 302 (specifically on semiconductor layer 302*c* of wafer 302). In one exemplary embodiment, the sacrificial and active layers are nanosheets. The term "nanosheet" as used herein, generally refers to a sheet or a layer having nanoscale dimensions. Further, the term "nanosheet" is meant to encompass other nanoscale structures such as nanowires. For instance, the term "nanosheet" can refer to a nanowire with a larger width, and/or the term "nanowire" can refer to a nanosheet with a smaller width, and vice versa.

As shown in MG. 3, the stack 304 specifically includes alternating layers of sacrificial layers 306*a,b,c,d*,etc. and active layers 308*a,b,c,d*,etc. deposited one on top of another. As will be described in detail below, the sacrificial layers 306*a,b,c,d*,etc. will be removed later on in the process to permit the formation of a gate-all-around configuration for the semiconductor device. By contrast, active layers 308*a,b,c,d*,etc. will remain in place and serve as channels of the semiconductor device. It is notable that the number of sacrificial layers 306*a,b,c,d*,etc. and active layers 308*a,b,c,d*,etc. shown in the figures is provided merely as an example to illustrate the present techniques. For instance, embodiments are contemplated herein where more or fewer sacrificial layers 306*a,b,c,d*,etc. and/or more or fewer active layers 308*a,b,c,d*,etc. are present than shown. Each of the sacrificial layers 306*a,b,c,d*,etc. and each of the active layers 308*a,b,c,d*,etc. are deposited/formed on semiconductor layer 302*c* of wafer 302 using an epitaxial growth process. According to an exemplary embodiment, each of the sacrificial layers 306*a,b,c,d*,etc. and each of the active layers 308*a,b,c,d*,etc. has a thickness of from about 6 nm to about 25 nm.

The materials employed for the sacrificial layers 306*a,b,c,d*,etc. and active layers 308*a,b,c,d*,etc. are such that the sacrificial layers 306*a,b,c,d*,etc. can be removed selective to the active layers 308*a,b,c,d*,etc. during fabrication. For instance, according to an exemplary embodiment, sacrificial layers 306*a,b,c,d*,etc. are each formed from SiGe, while active layers 308*a,b,c,d*,etc. are formed from Si. Etchants such as wet hot SC1, vapor phase hydrogen chloride (HCl), vapor phase chlorine trifluoride ($ClF_3$) and other reactive clean processes (RCP) are selective for etching of SiGe versus Si. This is, however, only one exemplary combination of sacrificial/active material that may be employed in accordance with the present techniques. For instance, by way of example only, the opposite configuration can instead be employed where sacrificial layers 306*a,b,c,d*,etc. are each formed from Si, and active layers 308*a,b,c,d*,etc. are each formed from SiGe.

Figure 4:
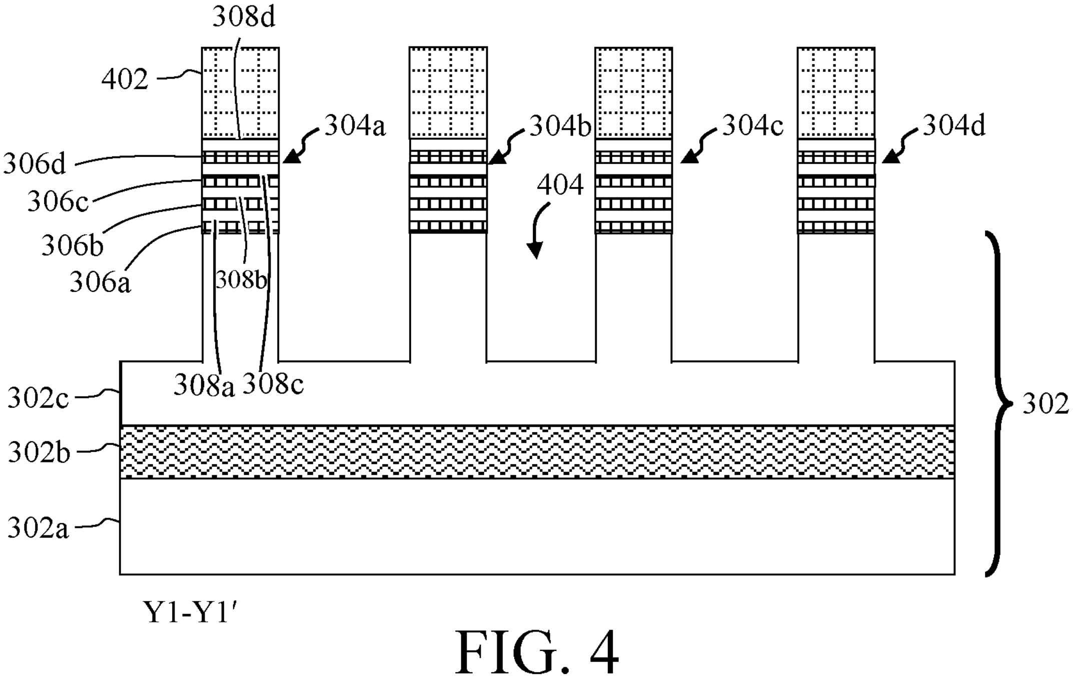
FIG. 4 is a Y1-Y1' cross-sectional view illustrating the stack of sacrificial/active layers having been patterned into individual device stacks, each containing a patterned portion of the sacrificial layers and active layers according to an embodiment of the present invention.

As shown in FIG. 4 (a Y1-Y1' cross-sectional view), standard lithography and etching techniques are then employed to pattern the sacrificial layers 306*a,b,c,d*,etc. and active layers 308*a,b,c,d*,etc. of stack 304 into individual device stacks 304*a,b,c,d*,etc. each containing a patterned portion of the sacrificial layers 306*a,b,c,d*,etc. and active layers 308*a,b,c,d*,etc. With standard lithography and etching techniques, a lithographic stack (not shown), e.g., photoresist/anti-reflective coating/organic planarizing layer, is used to pattern a hardmask 402 with the footprint and location of each of the individual device stacks 304*a,b,c,d*,etc. Suitable hardmask 402 materials include, but are not limited to, silicon nitride (SiN), silicon dioxide ($SiO_2$), titanium nitride (TiN) and/or silicon oxynitride (SiON). An etch is then performed to transfer the pattern from the hardmask 402 to the underlying stack 304 of sacrificial layers 306*a,b,c,d*,etc. and active layers 308*a,b,c,d*,etc. Suitable etching processes include, but are not limited to, directional (anisotropic) etching processes such as reactive ion etching. Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP).

As shown in FIG. 4, the etch used to pattern the individual device stacks 304*a,b,c,d*,etc. is extended beyond stack 304 resulting in the patterning of trenches 404 in the semiconductor layer 302*c* between the device stacks 304*a,b,c,d*,etc. As will be described in detail below, these trenches 404 will serve in forming shallow trench isolation regions in the wafer 302.

Figure 5:
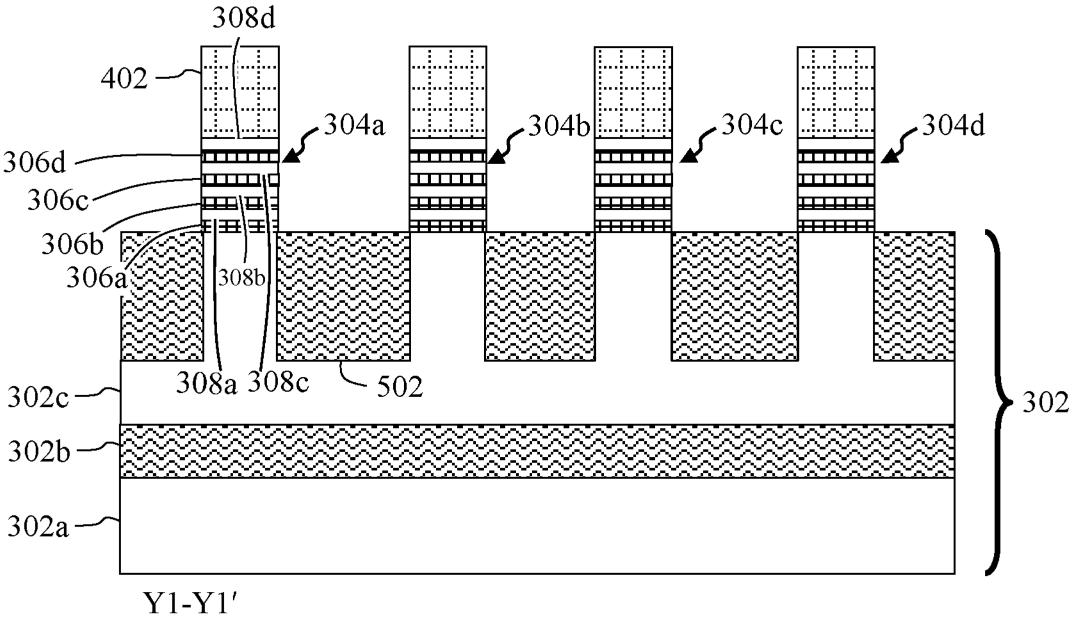
FIG. 5 is a Y1-Y1' cross-sectional view illustrating shallow trench isolation regions having been formed in the trenches between the individual device stacks according to an embodiment of the present invention.

Namely, as shown in FIG. 5 (a Y1-Y1' cross-sectional view), shallow trench isolation regions 502 are next formed in the trenches 404 in between the individual device stacks 304*a,b,c,d*,etc. Shallow trench isolation regions 502 serve to isolate the device stacks 304*a,b,c,d*,etc. To form the shallow trench isolation regions 502, a dielectric such as an oxide (which may also be generally referred to herein as a 'shallow trench isolation oxide') is deposited into, and filling, the trenches 404, followed by planarization and recess. Although not explicitly shown in the figures, a liner (e.g., a thermal oxide or SiN) may be deposited into the trenches 404 prior to the shallow trench isolation oxide. Suitable shallow trench isolation oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be used to deposit the shallow trench isolation oxide, after which the shallow trench isolation oxide can be planarized using a process such as chemical mechanical polishing. After that, the shallow trench isolation oxide is recessed using a dry or wet etch process to form the shallow trench isolation regions 502 at a base of the device stacks 304*a,b,c,d*,etc.

Figure 6:
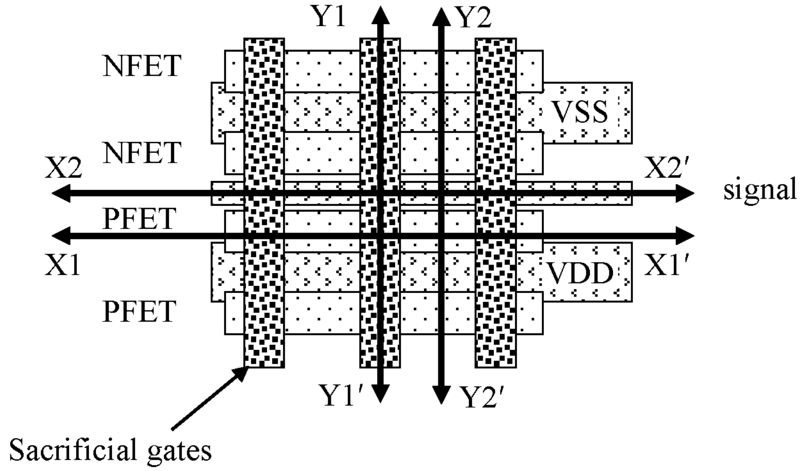
FIG. 6 is a top-down diagram illustrating an orientation of the X1-X1', X2-X2', Y1-Y1', Y2-Y2' cross-sectional views shown in the figures according to an embodiment of the present invention.

In the figures that follow, several different cross-sectional views will be shown depicting cuts through different regions of the semiconductor device structure. Thus, the top-down diagram shown in FIG. 6 is provided to illustrate the orientation of these various cross-sectional views. As highlighted above, the Y1-Y1' cross-sectional views shown throughout the figures depict cuts along and through one of the sacrificial gates. Further, as shown in FIG. 6, X1-X1' cross-sectional views will also be provided which depict cuts through and perpendicular to the sacrificial gates in the PFET-to-PFET space along one of the PFET transistors. Further, X2-X2' cross-sectional views will be provided which depict cuts through and perpendicular to the sacrificial gates in the NFET-to-PFET space along the backside signal line. Yet further, Y2-Y2' cross-sectional views will be provided which depict cuts in between two of the sacrificial gates.

Figure 7A:
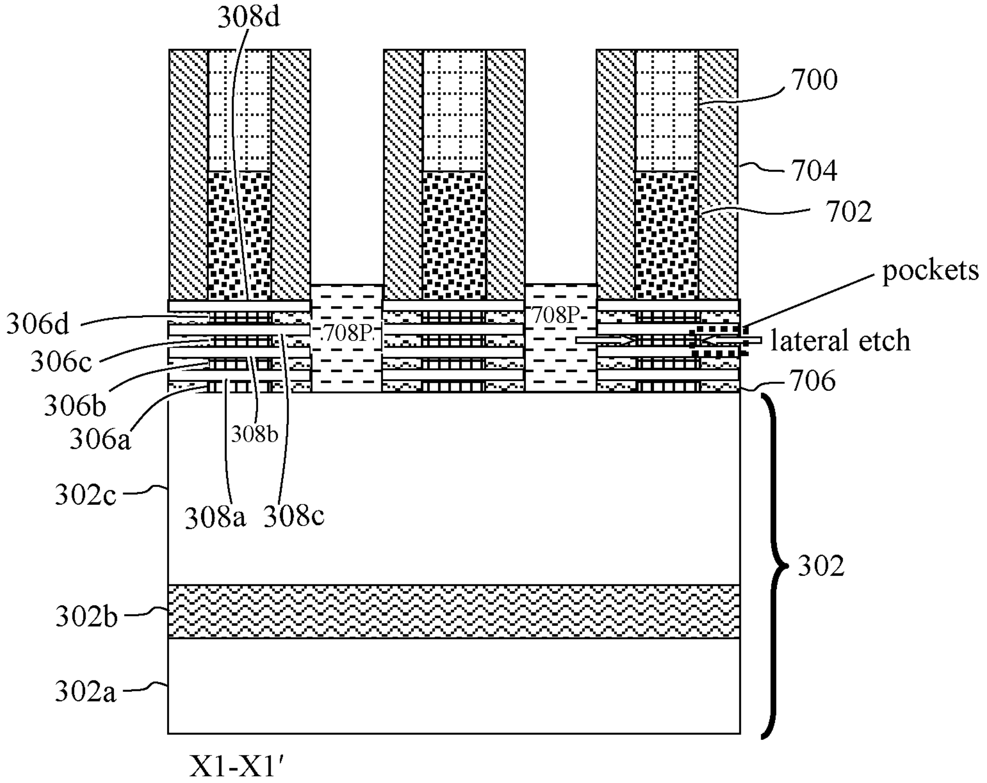
FIG. 7A is an X1-X1' cross-sectional view illustrating sacrificial gates having been formed on each of the device stacks, dielectric spacers having been formed on opposite sides of the sacrificial gates, inner spacers having been formed alongside the sacrificial layers of the device stacks, and PFET and NFET source/drain regions having been formed on opposite sides of the sacrificial gates alongside the sacrificial layers and active layers.
Figure 7B:
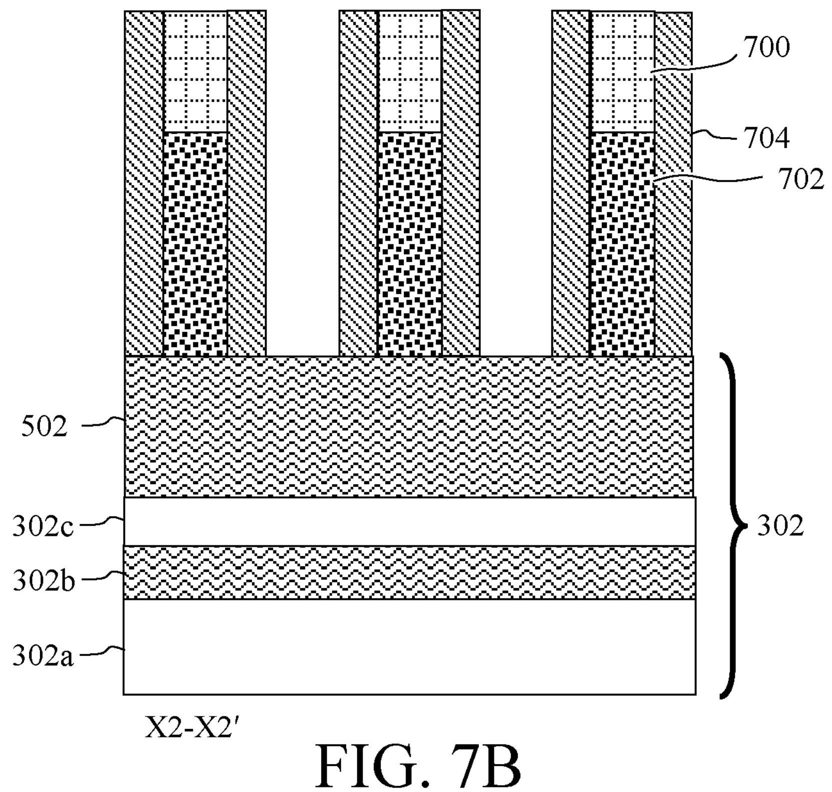
FIG. 7B is an X2-X2' cross-sectional view illustrating the sacrificial gates having been formed and the dielectric spacers having been formed on opposite sides of the sacrificial gates.
Figure 7C:
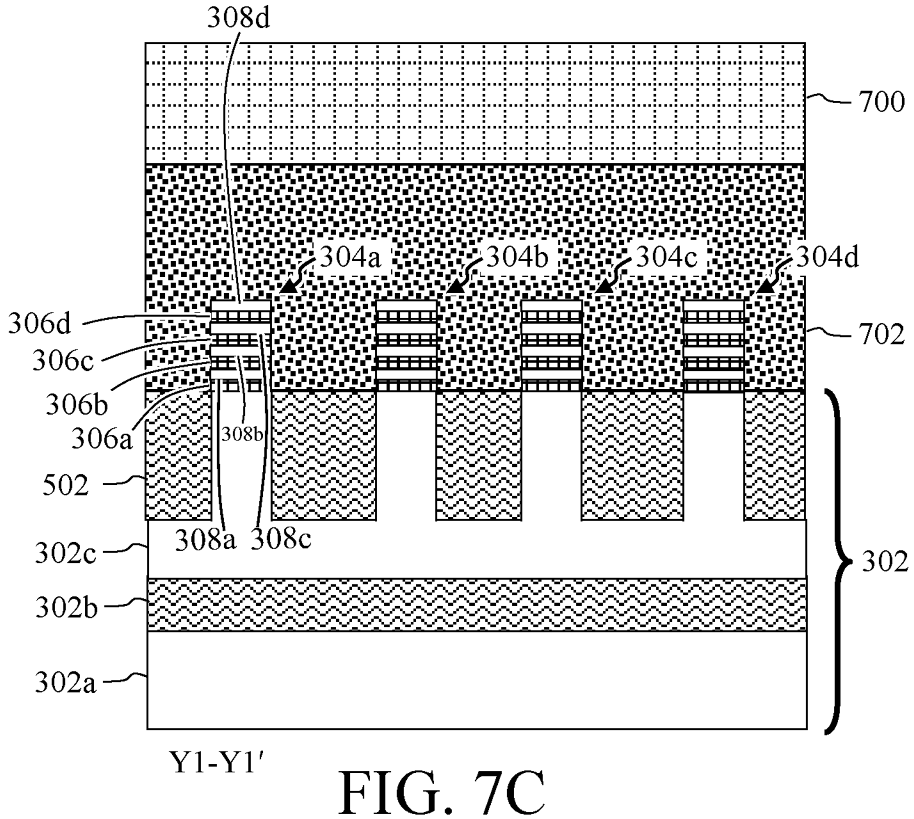
FIG. 7C is a Y1-Y1' cross-sectional view illustrating the sacrificial gates having been formed on each of the device stacks.
Figure 7D:
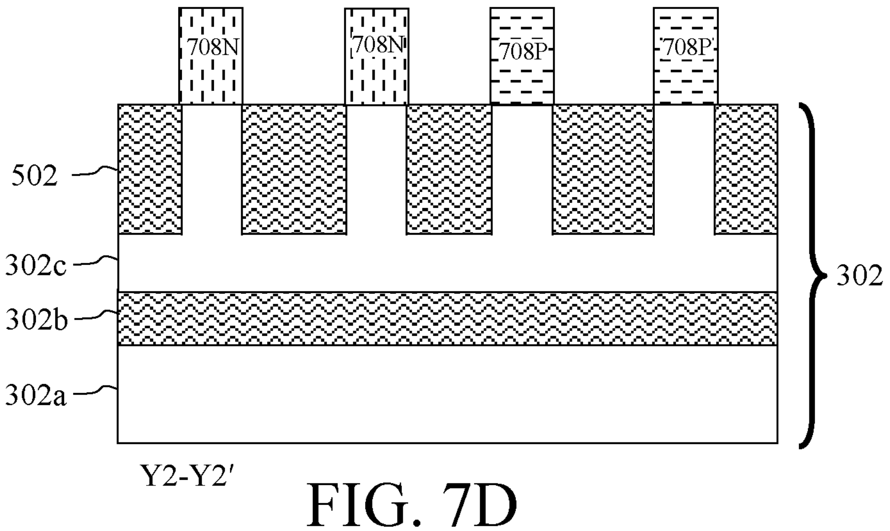
FIG. 7D is a Y2-Y2' cross-sectional view illustrating the PFET and NFET source/drain regions having been formed alongside the sacrificial layers and active layers according to an embodiment of the present invention.

As shown in FIG. 7A (an X1-X1' cross-sectional view), FIG. 7B (an X2-X2' cross-sectional view), FIG. 7C (a Y1-Y1' cross-sectional view), and FIG. 7D (a Y2-Y2' cross-sectional view), sacrificial gates 702 are formed on each of the device stacks 304*a,b,c,d*,etc., dielectric spacers 704 are formed on opposite sides of the sacrificial gates 702, inner spacers 706 are formed alongside the sacrificial layers 306*a,b,c,d*,etc. of the device stacks 304*a,b,c,d*,etc., and PFET and NFET source/drain regions 708P and 708N, respectively, are formed on opposite sides of the sacrificial gates 702 alongside the sacrificial layers 306*a,b,c,d*,etc. and active layers 308*a,b,c,d*,etc.

To form the sacrificial gates 702, a sacrificial gate material is first blanket deposited over the device stacks 304*a,b,c,d*, etc. Suitable sacrificial gate materials include, but are not limited to, poly-silicon and/or amorphous silicon. A process such as CVD, ALD or PVD can be employed to deposit the sacrificial gate material over the device stacks 304*a,b,c,d*, etc. According to an exemplary embodiment, a thin (e.g., from about 1 nm to about 3 nm) layer of SiOx (not shown) is first formed on the device stacks 304*a,b,c,d*,etc., followed by deposition of the poly-silicon and/or amorphous silicon.

Sacrificial gate hardmasks 700 are then formed on the sacrificial gate material marking the footprint and location of each of the sacrificial gates 702. As provided above, suitable hardmask materials include, but are not limited to, SiN, $SiO_2$, TiN and/or SiON. An etch using the sacrificial gate hardmasks 700 is then used to pattern the sacrificial gate material into the individual sacrificial gates 702 shown in FIGS. 7A-C.

Dielectric spacers 704 are then formed on opposite sides of the sacrificial gates 702 and sacrificial gate hardmasks 700. To do so, a dielectric spacer material is deposited over the semiconductor device structure, followed by an etch to pattern the dielectric spacer material into the dielectric spacers 704 alongside the sacrificial gate hardmasks 700 and sacrificial gates 702. Suitable dielectric spacer materials include, but are not limited to, SiOx, silicon carbide (SiC), silicon oxycarbide (SiCO) and/or SiN, which can be deposited using a process such as CVD, ALD or PVD.

Prior to forming the PFET source/drain regions 708P and NFET source/drain regions 708N, inner spacers 706 are fabricated alongside the sacrificial layers 306*a,b,c,d*,etc. in each of the device stacks 304*a,b,c,d*,etc. To do so, a selective lateral etch is performed to recess the sacrificial layers 306*a,b,c,d*,etc. exposed along the sidewalls of the device stacks 304*a,b,c,d*,etc. See, for example, FIG. 7A. This recess etch forms pockets along the sidewalls of the device stacks 304*a,b,c,d*,etc. that are then filled with a dielectric inner spacer material to form the inner spacers 706 within the pockets. The inner spacers 706 will offset the replacement metal gates (see above) from the PFET and NFET source/drain regions 708P and 708N. As provided above, sacrificial layers 306*a,b,c,d*,etc. can be formed from SiGe. In that case, a SiGe-selective etching process can be used for the recess etch. Suitable dielectric inner spacer materials include, but are not limited to, SiN, SiOx, SiC and/or SiCO, which can be deposited into the pockets using a process such as CVD, ALD or PVD. Following deposition, excess dielectric inner spacer material can be removed using an isotropic etching process such as a wet etch or selective dry etch.

The PFET source/drain regions 708P and NFET source/drain regions 708N are then formed on opposite sides of the sacrificial gates 702 alongside the sacrificial layers 306*a,b,c,d*,etc. and active layers 308*a,b,c,d*,etc. According to an exemplary embodiment, PFET source/drain regions 708P and NFET source/drain regions 708N are each formed from an in-situ doped (i.e., during growth) or ex-situ doped (e.g., via ion implantation) epitaxial material such as epitaxial Si, epitaxial SiGe, etc. Suitable p-type dopants for PFET source/drain regions 708P include, but are not limited to, boron (B). Suitable n-type dopants for NFET source/drain regions 708N include, but are not limited to, phosphorous (P) and/or arsenic (As). With inner spacers 706 in place along the sidewalls of the device stacks 304*a,b,c,d*,etc., epitaxial growth of the PFET and NFET source/drain regions 708P and 708N is templated only from the ends of the active layers 308*a,b,c,d*,etc. along the sidewalls of the device stacks 304*a,b,c,d*,etc.

Figure 8:
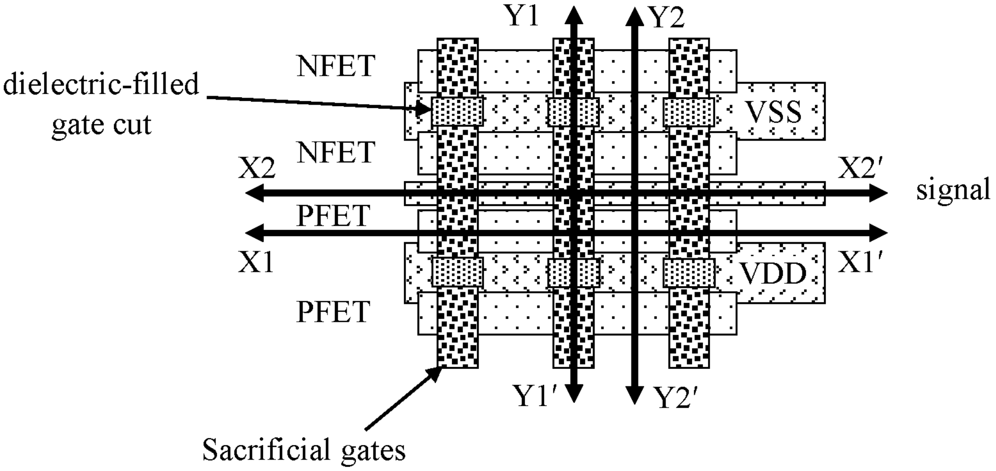
FIG. 8 is a top-down diagram illustrating an orientation of dielectric-filled gate cut openings along the sacrificial gates according to an embodiment of the present invention.

Following formation of the PFET and NFET source/drain regions 708P and 708N, steps will be taken to selectively remove the sacrificial gate hardmasks 700, the sacrificial gates 702 and underlying sacrificial layers 306*a,b,c,d*,etc. in order to form the replacement metal gates (see below). However, prior to this, gate cut openings are created in the sacrificial gates 702 between adjacent PFETs and NFETs. The gate cut openings are then filled with a gate cut dielectric material which will serve to isolate the gates of the respective PFETs and NFETs. The top-down diagram shown in FIG. 8 is provided to aid the description that follows by illustrating the orientation of these dielectric-filled gate cut openings along the sacrificial gates 702 with respect to the positioning of the PFET and NFET transistors. Notably, as shown in FIG. 8, the dielectric-filled gate cut openings are present along each of the sacrificial gates 702 in the PFET-to-PFET space and in the NFET-to-NFET space on the frontside of the wafer 302.

Figure 9A:
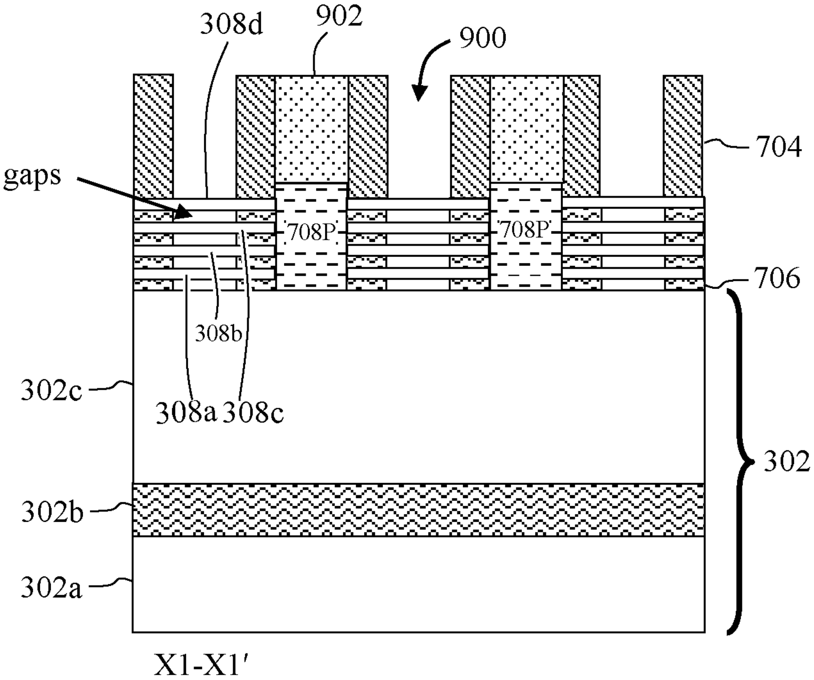
FIG. 9A is an X1-X1' cross-sectional view illustrating a (first) interlayer dielectric having been deposited onto the semiconductor device structure, the sacrificial gate hardmasks and sacrificial gates having been selectively removed, and the sacrificial layers having been selectively removed from the device stacks creating gaps in the device stacks.
Figure 9B:
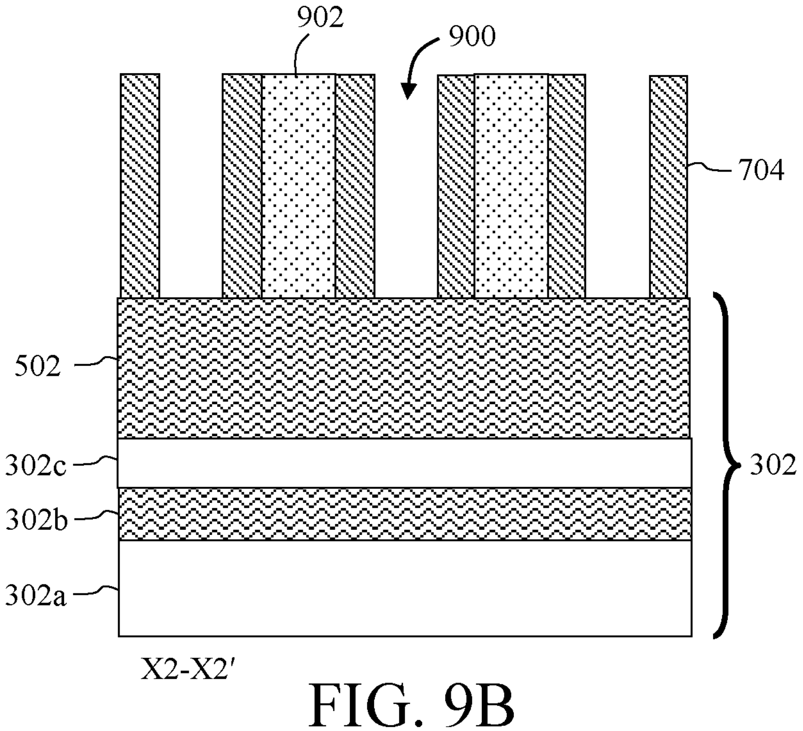
FIG. 9B is an X2-X2' cross-sectional view illustrating the first interlayer dielectric having been deposited onto the semiconductor device structure, and the sacrificial gate hardmasks and sacrificial gates having been selectively removed.
Figure 9C:
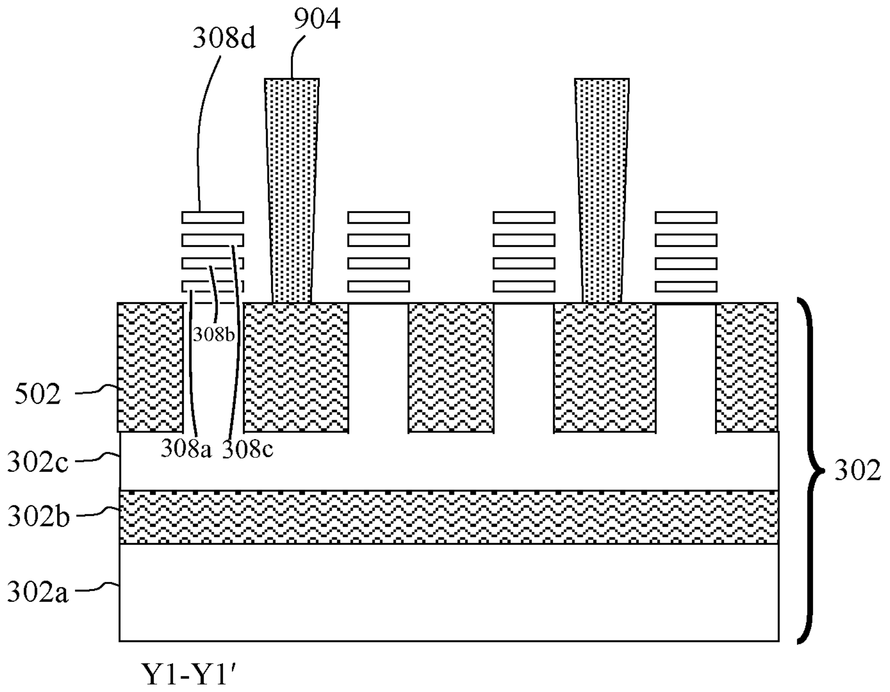
FIG. 9C is a Y1-Y1' cross-sectional view illustrating, the dielectric-filled gate cut openings having been formed, the sacrificial gate hardmasks and sacrificial gates having been selectively removed, and the sacrificial layers having been selectively removed from the device stacks creating the gaps in the device stacks.
Figure 9D:
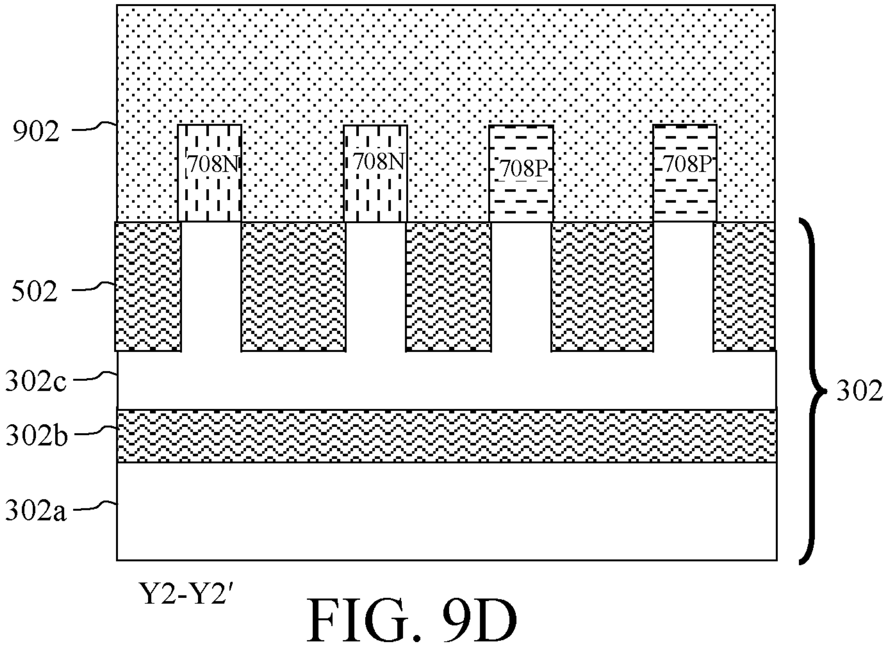
FIG. 9D is a Y2-Y2' cross-sectional view illustrating the first interlayer dielectric having been deposited onto the semiconductor device structure according to an embodiment of the present invention.

Namely, as shown in FIG. 9A (an X1-X1' cross-sectional view), FIG. 9B (an X2-X2' cross-sectional view), FIG. 9C (a Y1-Y1' cross-sectional view), and FIG. 9D (a Y2-Y2' cross-sectional view), an interlayer dielectric 902 is deposited onto the device structure, the gate cut openings are formed in the sacrificial gates 702 and filled with a gate cut dielectric material 904, the sacrificial gate hardmasks 700 and sacrificial gates 702 are selectively removed, and the sacrificial layers 306*a,b,c,d*,etc. are selectively removed from the device stacks 304*a,b,c,d*,etc. thereby releasing the active layers 308*a,b,c,d*,etc.

Suitable interlayer dielectric 902 materials include, but are not limited to, silicon nitride (SiN), silicon oxycarbide (SiOC) and/or oxide low-κ materials such as SiOx and/or oxide ULK-ILD materials such as pSiCOH, which can be deposited onto the semiconductor device structure using a process such as CVD, ALD or PVD. According to an exemplary embodiment, the interlayer dielectric 902 is a different dielectric material from the shallow trench isolation regions 502 (e.g., interlayer dielectric 902 can be SiN, and the shallow trench isolation regions 502 can be SiOx). Following deposition, the interlayer dielectric 902 can be planarized using a process such as chemical mechanical polishing. According to an exemplary embodiment, this chemical mechanical polishing serves to remove the sacrificial gate hardmasks 700 thereby exposing the underlying sacrificial gates 702, which are then also removed.

Standard lithography and etching techniques (see above) can be employed to pattern the gate cut openings in the sacrificial gates 702 at the locations shown, for example, in FIG. 8. Suitable gate cut dielectric materials 904 include, but are not limited to, SiN, SiOx, SiC and/or SiCO, which can be deposited into the gate cut openings using a process such as CVD, ALD or PVD. Following deposition, the excess gate cut dielectric material 904 can be removed using a process such as chemical mechanical polishing.

Removal of the sacrificial gates 702 forms gate trenches 900 in the interlayer dielectric 902 over the device stacks 304*a,b,c,d*,etc. in between the PFET and NFET source/drain regions 708P and 708N. The sacrificial layers 306*a,b,c,d*, etc., now accessible through the gate trenches 900, are then selectively removed creating gaps in the device stacks 304*a,b,c,d*,etc. between the active layers 308*a,b,c,d*,etc. According to an exemplary embodiment, sacrificial layers 306*a,b,c,d*,etc. are formed from SiGe, while active layers 308*a,b,c,d*,etc. are formed from Si. In that case, etchants such as wet hot SC1, vapor phase HCl, vapor phase $ClF_3$ and/or other reactive clean processes can be employed to remove the sacrificial layers 306*a,b,c,d*,etc., selective to the active layers 308*a,b,c,d*,etc. Removal of sacrificial layers 306*a,b,c,d*,etc. releases the active layers 308*a,b,c,d*,etc. from the device stacks 304*a,b,c,d*,etc. These 'released' active layers 308*a,b,c,d*,etc. will be used to form the channels of the semiconductor device. As will be described in detail below, the replacement metal gates will be formed in the gate trenches 900 and the gaps, and will fully surround a portion of each of the active layers 308*a,b,c,d*,etc. in a gate-all-around configuration.

Figure 10:
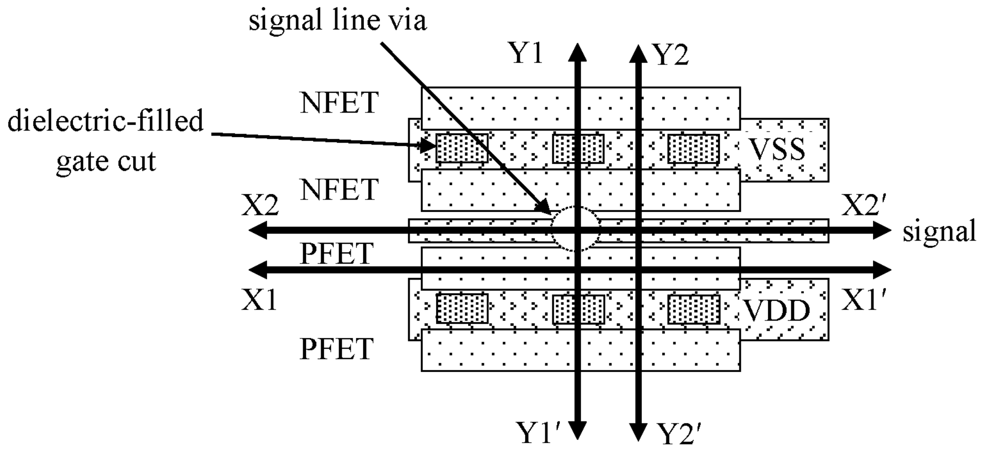
FIG. 10 is a top-down diagram illustrating an orientation of a signal line via with respect to a positioning of the PFET and NFET transistors according to an embodiment of the present invention.

As highlighted above, the present signal line contact is formed concurrently with the replacement metal gate. To do so, a signal line via is first formed (on the frontside of wafer 302) in the NFET-to-PFET space. The top-down diagram shown in FIG. 10 is provided to aid the description that follows by illustrating the orientation of this signal line via with respect to the positioning of the PFET and NFET transistors.

Figure 11A:
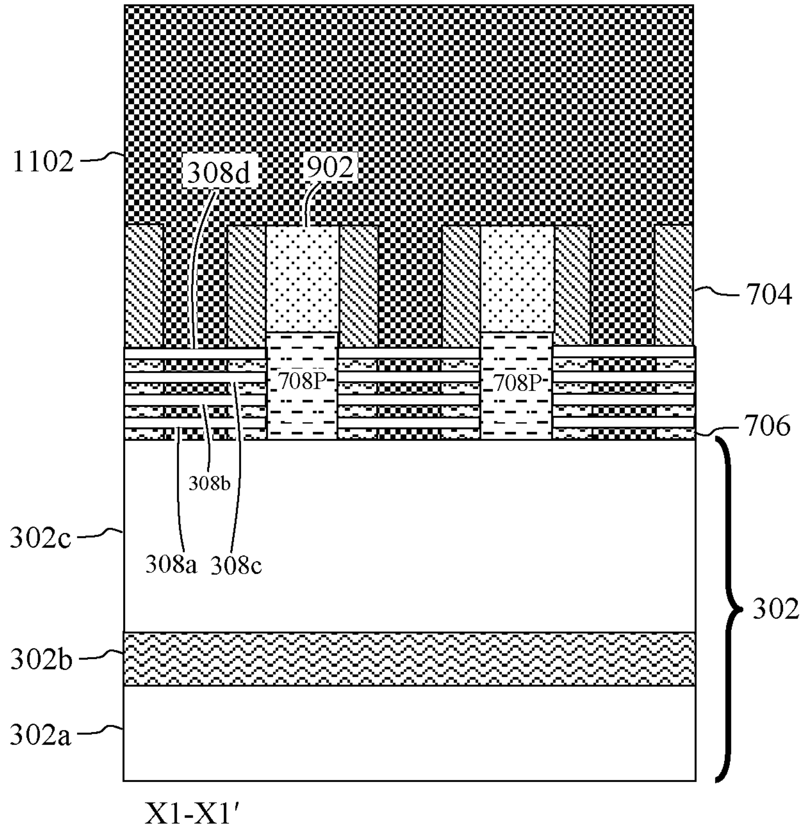
FIG. 11A is an X1-X1' cross-sectional view illustrating a fill material having been deposited over the first interlayer dielectric and into/filling the gate trenches and the gaps.
Figure 11B:
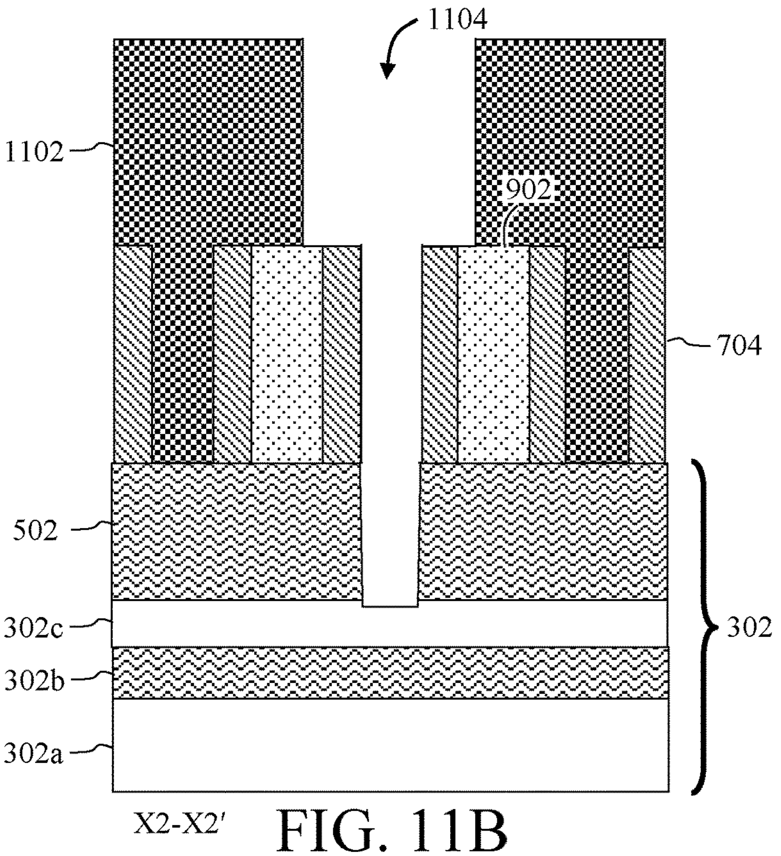
FIG. 11B is an X2-X2' cross-sectional view illustrating the fill material having been deposited over the first interlayer dielectric and into/filling the gate trenches and the gaps, and a signal line via having been patterned through the fill material in an NFET-to-PFET space.
Figure 11C:
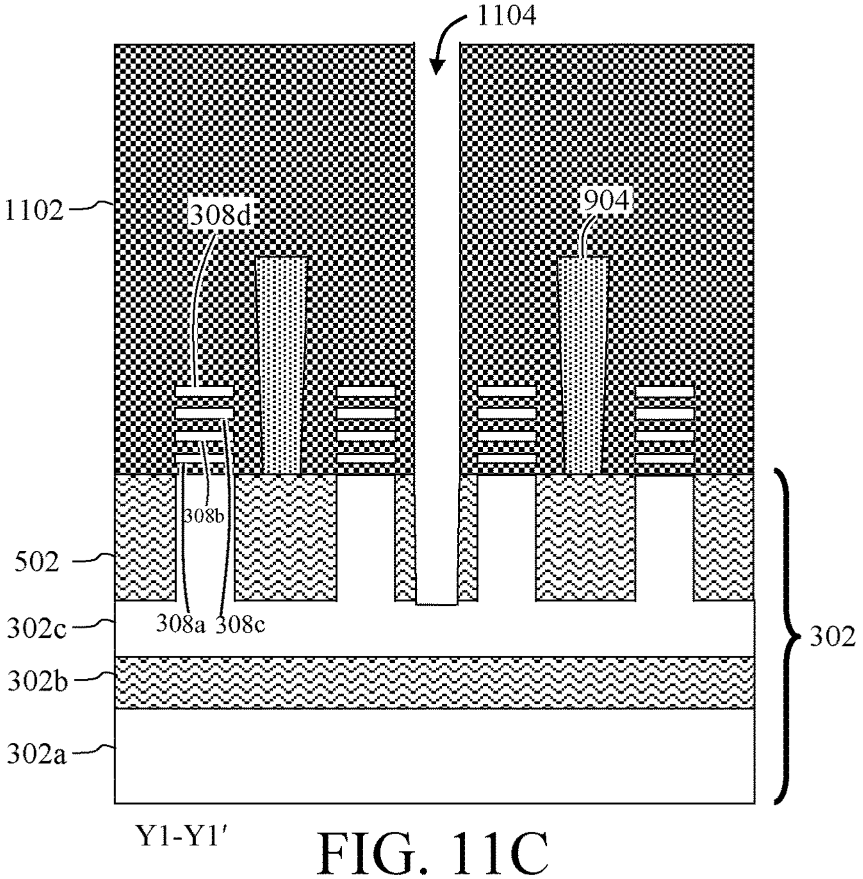
FIG. 11C is a Y1-Y1' cross-sectional view illustrating the fill material having been deposited over the first interlayer dielectric and into/filling the gate trenches and the gaps, and a signal line via having been patterned through the fill material in an NFET-to-PFET space.
Figure 11D:
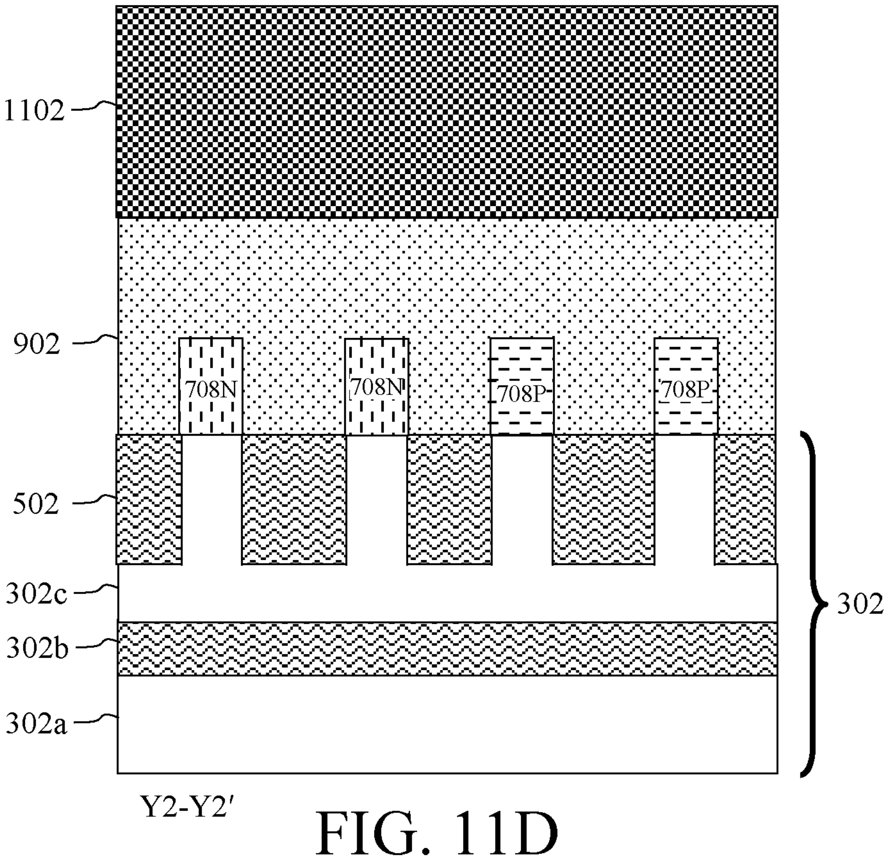
FIG. 11D is a Y2-Y2' cross-sectional view illustrating the fill material having been deposited over the first interlayer dielectric according to an embodiment of the present invention.

Namely, as shown in FIG. 11A (an X1-X1' cross-sectional view), FIG. 11B (an X2-X2' cross-sectional view), FIG. 11C (a Y1-Y1' cross-sectional view), and FIG. 11D (a Y2-Y2' cross-sectional view), a fill material 1102 is first deposited over the interlayer dielectric 902 and into/filling the gate trenches 900 and the gaps, and the signal line via 1104 is patterned through the fill material 1102 in the NFET-to-PFET space. Suitable fill materials 1102 include, but are not limited to, organic planarizing layer materials, which can be deposited over the interlayer dielectric 902 and into/filling the gate trenches 900 and the gaps using a casting process such as spray coating or spin casting. As shown in FIGS. 11A-D, the fill material 1102 can overfill the gate trenches 900 and the gaps such that a portion of the fill material 1102 is present over the interlayer dielectric 902.

Standard lithography and etching techniques (see above) can be employed to pattern the signal line via 1104 through the fill material 1102 in the NFET-to-PFET space. Semiconductor layer 302*c* acts as an etch stop for the signal line via etch. Thus, as shown, for example, in FIGS. 11B and 11C, signal line via 1104 is positioned between the dielectric spacers 704 along adjacent NFET and PFET transistors, i.e., in the NFET-to-PFET space, and extends through the fill material 1102 and underlying shallow trench isolation region 502, down to the semiconductor layer 302*c*.

Figure 12A:
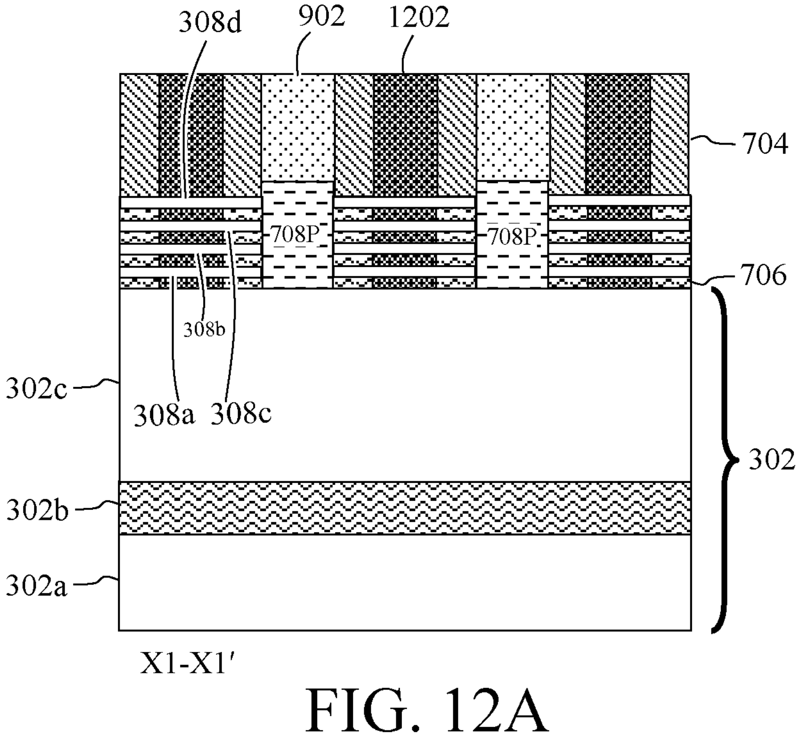
FIG. 12A is an X1-X1' cross-sectional view illustrating the fill material having been removed re-opening the gate trenches and the gaps, replacement metal gates having been formed in the gate trenches and the gaps.
Figure 12B:
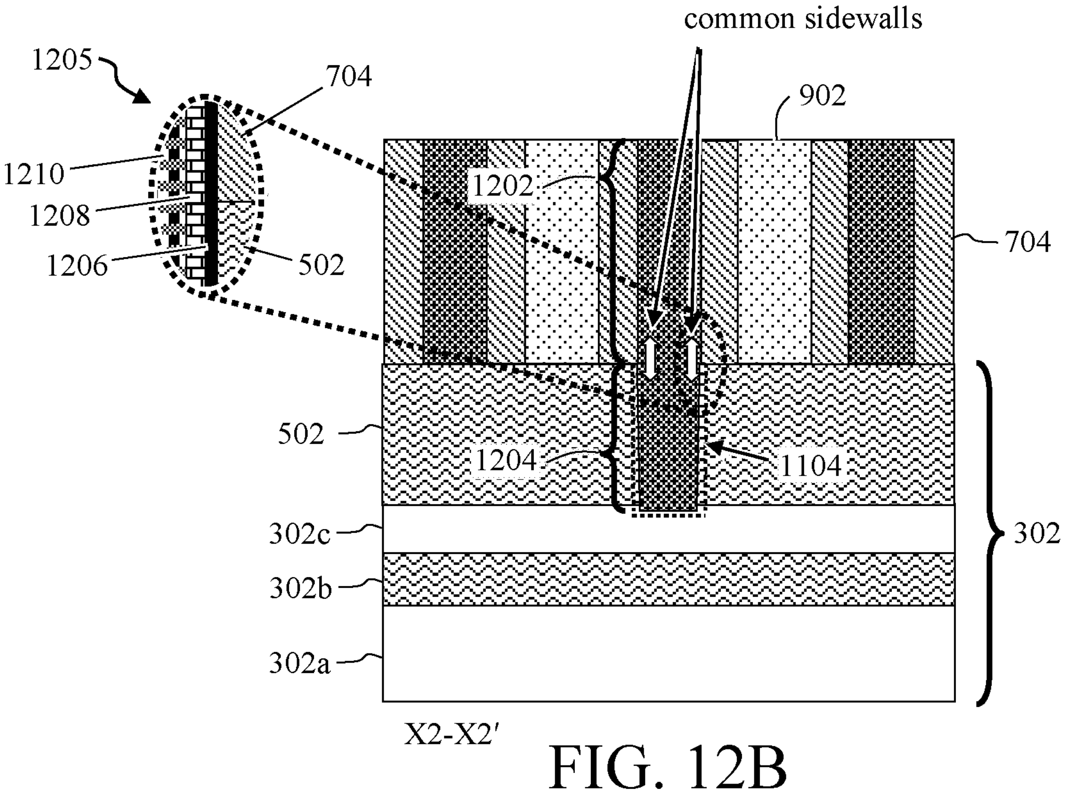
FIG. 12B is an X2-X2' cross-sectional view illustrating the fill material having been removed re-opening the gate trenches and the gaps, the replacement metal gates having been formed in the gate trenches and the gaps, and a signal line contact having been formed in the signal line via.
Figure 12C:
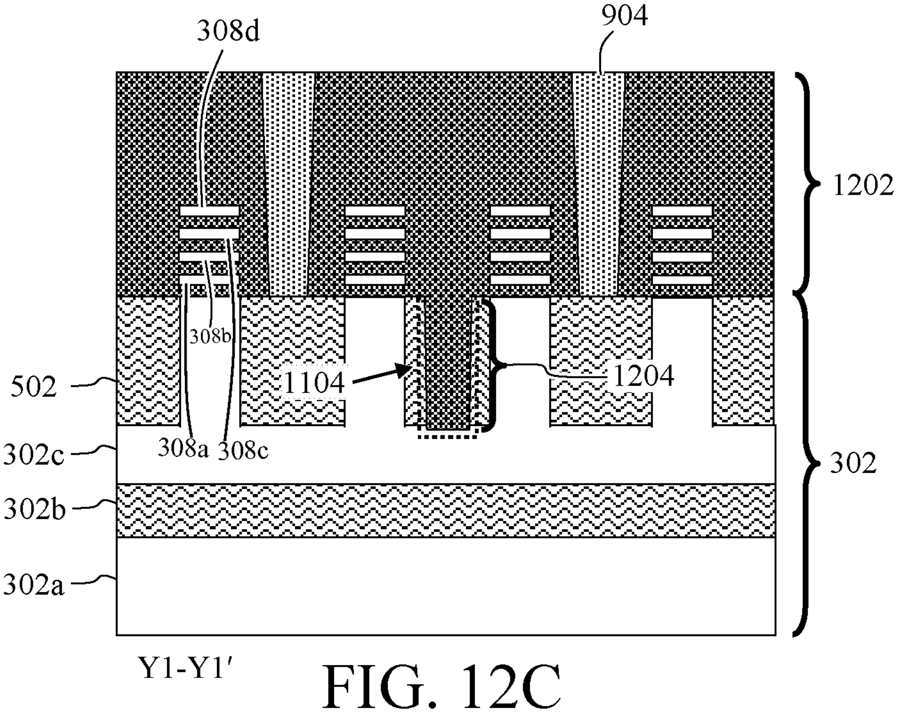
FIG. 12C is a Y1-Y1' cross-sectional view illustrating the fill material having been removed re-opening the gate trenches and the gaps, the replacement metal gates having been formed in the gate trenches and the gaps, and the signal line contact having been formed in the signal line via.
Figure 12D:
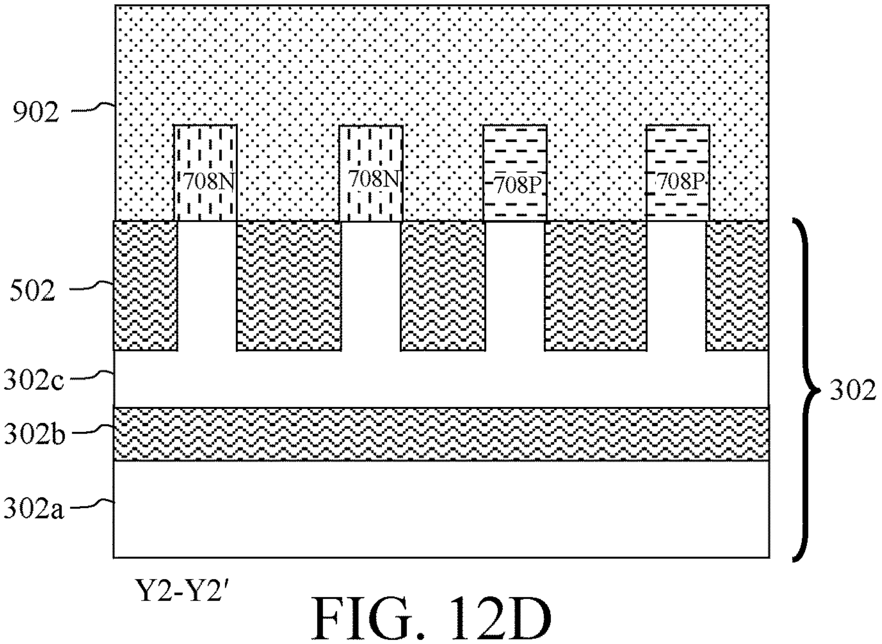
FIG. 12D is a Y2-Y2' cross-sectional view illustrating the fill material having been removed according to an embodiment of the present invention.

As shown in FIG. 12A (an X1-X1' cross-sectional view), FIG. 12B (an X2-X2' cross-sectional view), FIG. 12C (a Y1-Y1' cross-sectional view), and FIG. 12D (a Y2-Y2' cross-sectional view), the fill material 1102 is then removed re-opening the gate trenches 900 and the gaps. Replacement metal gates 1202 are then formed in the gate trenches 900 and the gaps surrounding a portion of each of the active layers 308*a,b,c,d*,etc. in a gate-all-around configuration, and a signal line contact 1204 is formed in the signal line via 1104. Notably, metallization of the replacement metal gates 1202 and the signal line contact 1204 occurs concurrently. Thus, according to an exemplary embodiment, the replacement metal gates 1202 and the signal line contact 1204 are formed from the same combination of materials. For instance, according to an exemplary embodiment, the signal line contact 1204 contains the same replacement gate materials (e.g., high-κ gate dielectric, workfunction-setting metal(s), fill metal, etc.—see below) as the replacement metal gates 1202. The simple term 'gates' may also be used herein when referring to replacement metal gates 1202.

As provided above, the fill material 1102 can be an organic planarizing layer material. In that case, the fill material 1102 can be removed using an ashing process. Following removal of the fill material 1102, what remains of the signal line via 1104 (shown using dashed outlines in FIGS. 12B and 12C) is present in the shallow trench isolation regions 502 below the device stacks 304*a,b,c,d*,etc.

According to an exemplary embodiment, the replacement metal gates 1202 and the signal line contact 1204 are formed concurrently, meaning that the materials which are deposited into the gate trenches 900 and gaps to form the replacement metal gates 1202 are, at the same time, also deposited into the signal line via 1104 to form the signal line contact 1204. For instance, referring to magnified view 1205 in FIG. 12B, in this example formation of the replacement metal gates 1202 and the signal line contact 1204 begins with the deposition of a (conformal) gate dielectric 1206 into and lining each of the gate trenches 900, the gaps, and the signal line via 1104. According to an exemplary embodiment, gate dielectric 1206 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, hafnium oxide ($HfO_2$) and/or lanthanum oxide ($La_2O_3$). A process such as CVD, ALD or PVD can be employed to deposit the gate dielectric 1206. According to an exemplary embodiment, gate dielectric 1206 has a thickness of from about 1 nm to about 5 nm and ranges therebetween. A reliability anneal can be performed following deposition of gate dielectric 1206. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as, but not limited to, nitrogen.

At least one workfunction-setting metal 1208 is then deposited into the gate trenches 900, the gaps, and the signal line via 1104 over the gate dielectric 1206. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD or PVD can be employed to deposit the workfunction-setting metal(s) 1208, after which the metal overburden can be removed using a process such as chemical mechanical polishing.

Optionally, a (low-resistance) fill metal 1210 can be deposited into the gate trenches 900, the gaps, and the signal line via 1104 over the workfunction-setting metal(s) 1208 so as to fill in any remaining spaces in the replacement metal gates 1202 and/or signal line contact 1204. Suitable low-resistance fill metals 1210 include, but are not limited to, W, cobalt (Co), ruthenium (Ru) and/or Al which can be deposited using a process or combination of processes including, but not limited to, CVD, ALD, PVD, sputtering, plating, evaporation, ion beam deposition, electron beam deposition, laser assisted deposition, chemical solution deposition, etc.

By concurrently forming the replacement metal gates 1202 and the signal line contact 1204, proper contact and alignment of the signal line contact 1204 with the corresponding replacement metal gate 1202 is ensured. Namely, the signal line contact 1204 is fully-aligned with a given one of the replacement metal gates 1202 (i.e., the center replacement metal gate 1202 in this example). For instance, as shown in FIG. 12B, in the X2-X2' direction the replacement metal gate 1202 and the signal line contact 1204 share common sidewalls. As shown in FIGS. 12B and 12C, the signal line contact 1204 extends vertically out from the corresponding replacement metal gate 1202. This will enable connection of the signal line contact 1204 to the backside signal line (to be formed below).

Figure 13A:
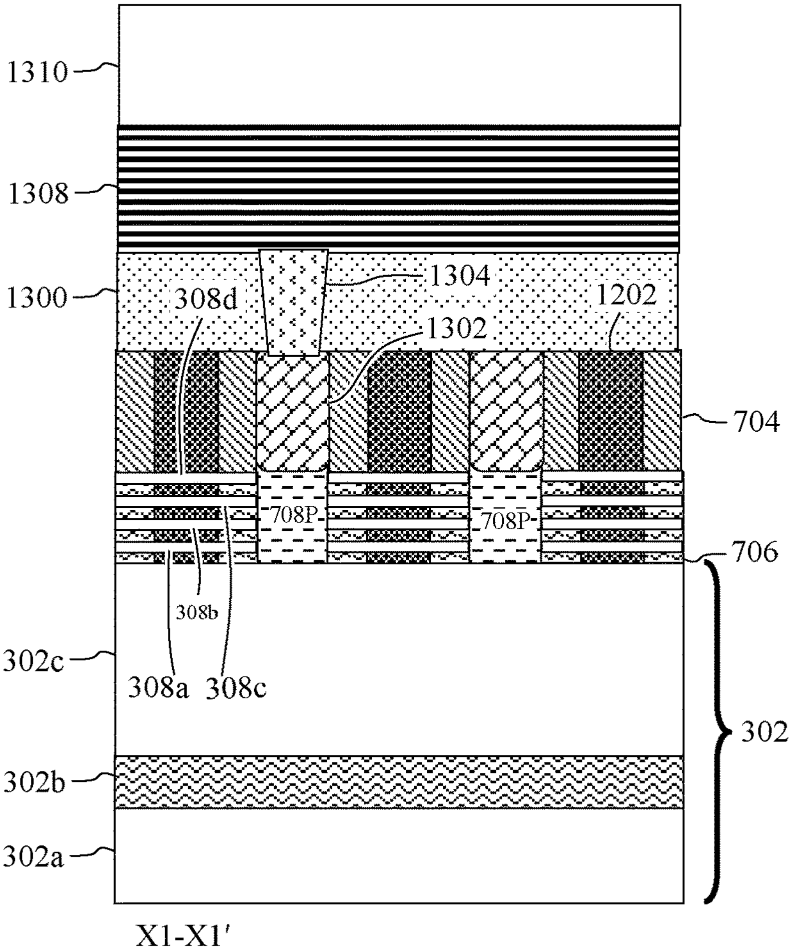
FIG. 13A is an X1-X1' cross-sectional view illustrating middle of line source/drain region contacts having been formed in a (second) interlayer dielectric, followed by a back end of line interconnect layer, and the wafer having been bonded to a carrier wafer.
Figure 13B:
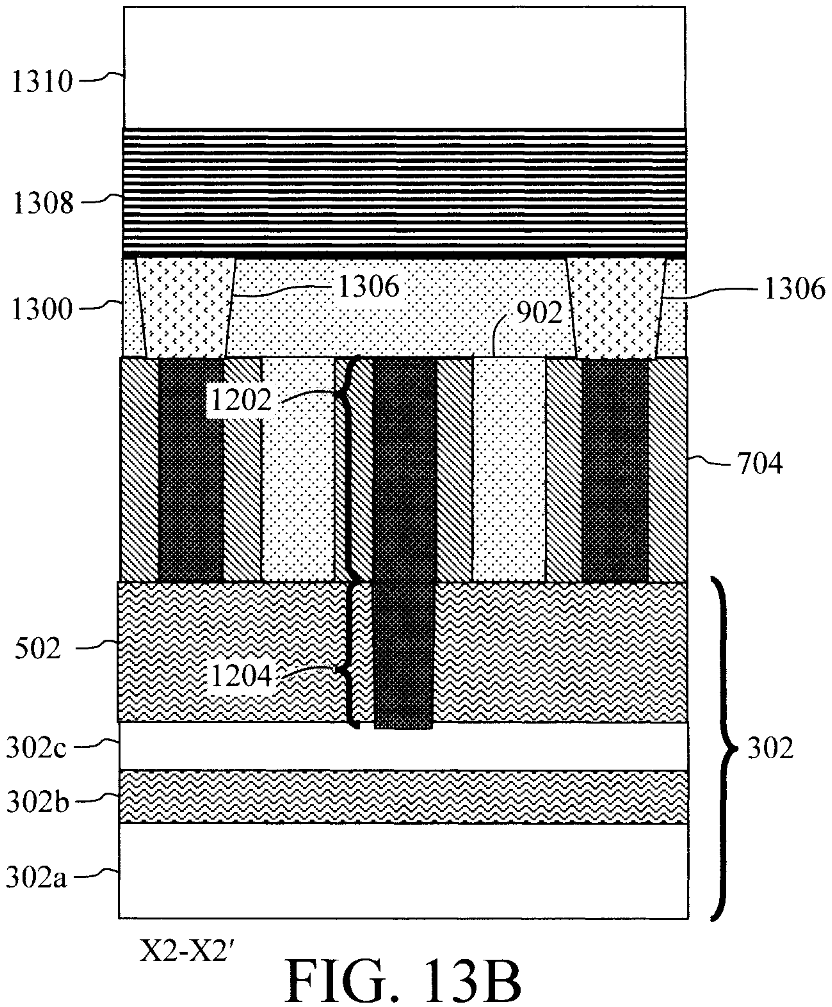
FIG. 13B is an X2-X2' cross-sectional view illustrating middle of line gate contacts having been formed in the second interlayer dielectric, followed by the back end of line interconnect layer, and the wafer having been bonded to the carrier wafer.
Figure 13C:
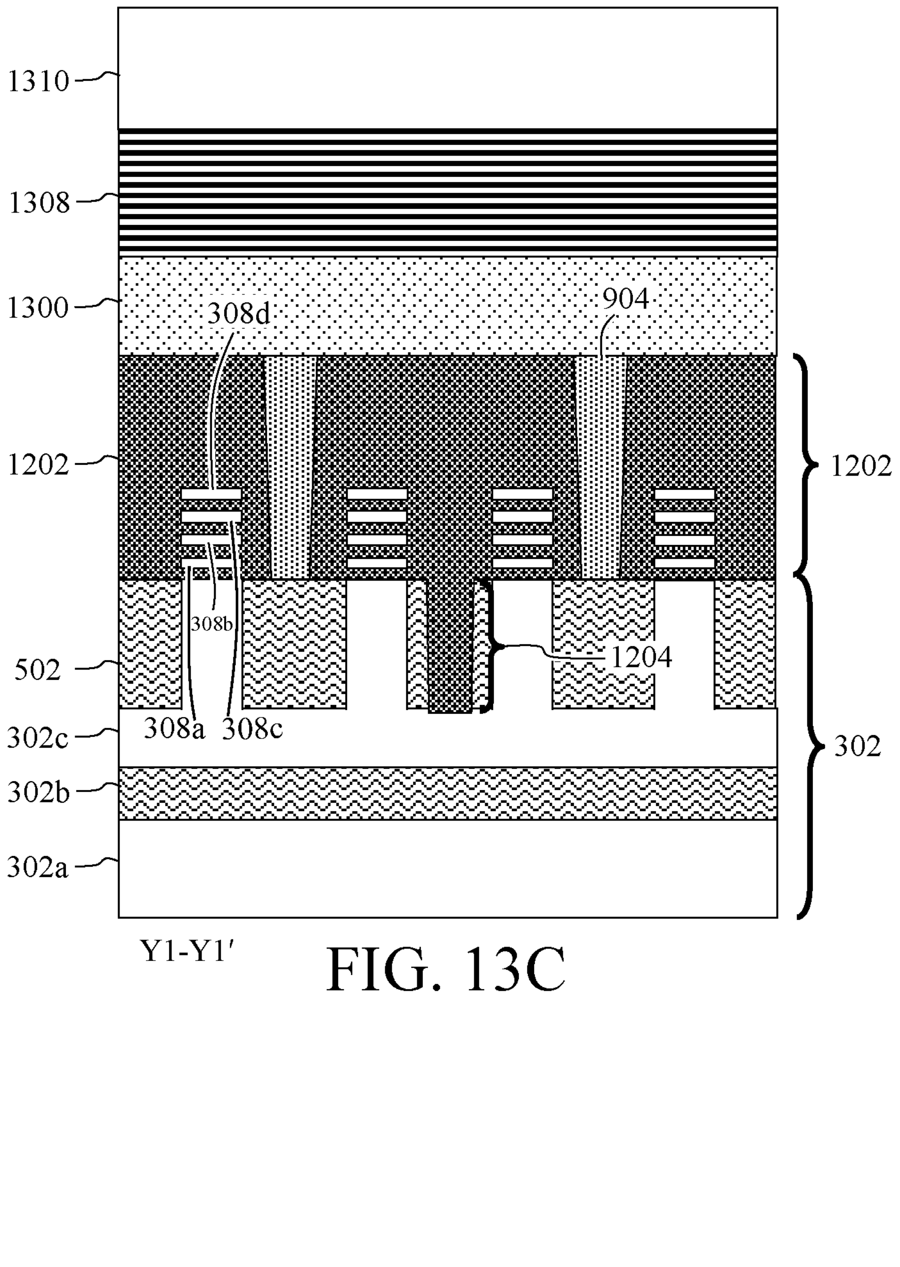
FIG. 13C is a Y1-Y1' cross-sectional view illustrating the back end of line interconnects having been formed and the wafer having been bonded to the carrier wafer.
Figure 13D:
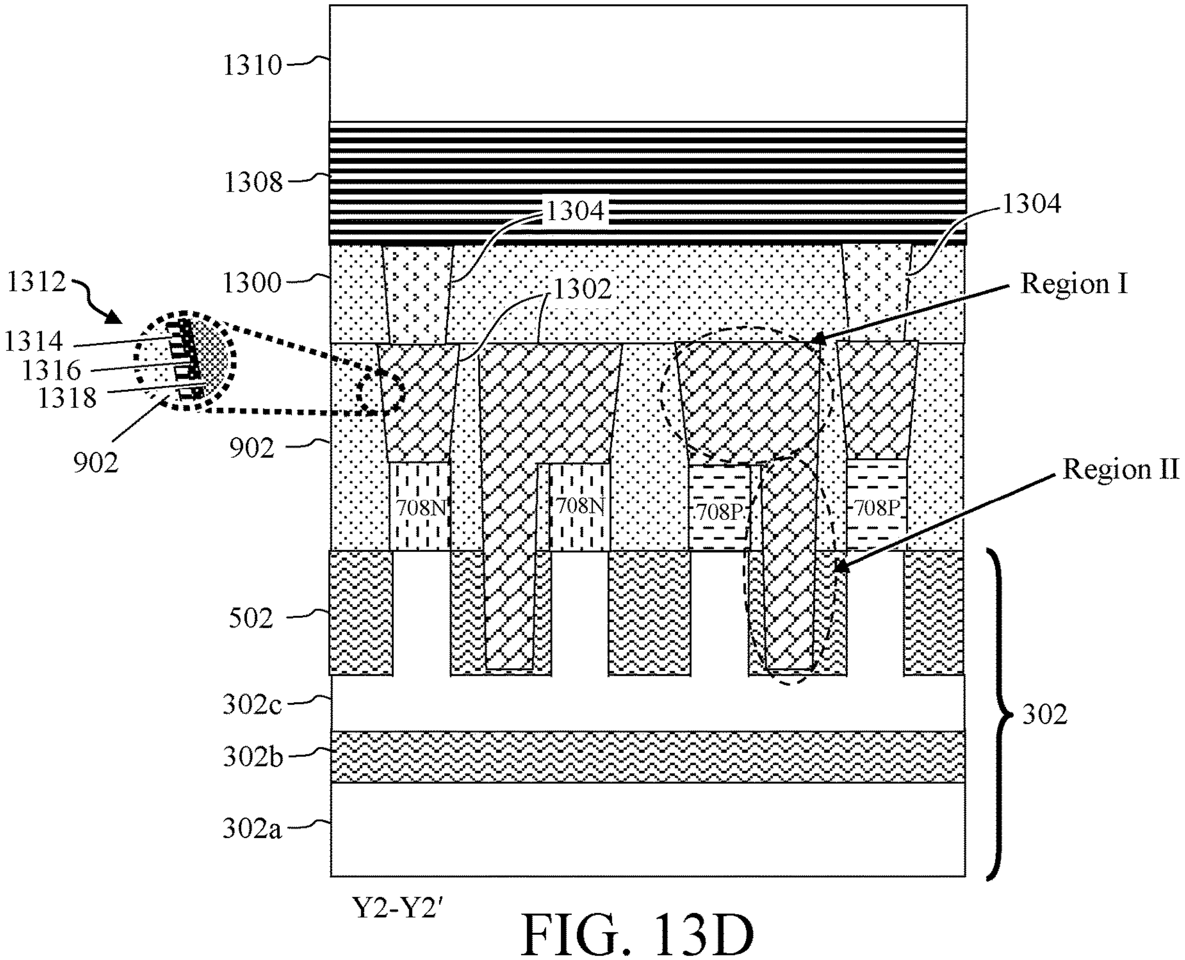
FIG. 13D is a Y2-Y2' cross-sectional view illustrating the middle of line source/drain region contacts having been formed in the second interlayer dielectric, followed by the back end of line interconnect layer, and the wafer having been bonded to the carrier wafer according to an embodiment of the present invention.

As shown in FIG. 13A (an X1-X1' cross-sectional view), FIG. 13B (an X2-X2' cross-sectional view), FIG. 13C (a Y1-Y1' cross-sectional view), and FIG. 13D (a Y2-Y2' cross-sectional view), middle of line source/drain region contacts 1302/1304 and gate contacts 1306 are next formed, followed by back end of line interconnect layer 1308, and bonding to a carrier wafer 1310. Namely, as will be described in detail below, carrier wafer 1310 will enable wafer 302 to be flipped for backside processing, including formation of the VDD and VSS power rails and signal line.

Source/drain region contacts 1302 are formed by using standard lithography and etching techniques (see above) to first pattern trenches in the interlayer dielectric 902 and the shallow trench isolation regions 502 over/alongside the PFET and NFET source/drain regions 708P and 708N, followed by metallization to form the source/drain region contacts 1302. Referring to magnified view 1312 in FIG. 13D, in this example metallization includes first depositing a silicide liner 1314 into and lining the trenches, depositing a metal adhesion layer 1316 onto the silicide liner 1314, and then depositing a fill metal 1318 onto the metal adhesion layer 1316. Suitable silicide liner 1314 materials include, but are not limited to, titanium (Ti), nickel (Ni) and/or nickel platinum (NiPt), which can be deposited using a process such as CVD, ALD or PVD. According to an exemplary embodiment, silicide liner 1314 has a thickness of from about 1 nm to about 5 nm. Suitable metal adhesion layer 1316 materials include, but are not limited to, TiN and/or TaN, which can be deposited onto the silicide liner 1314 using a process such as CVD, ALD or PVD. According to an exemplary embodiment, metal adhesion layer 1316 has a thickness of from about 1 nm to about 5 nm. Suitable fill metals 1318 include, but are not limited to, W, Co, Ru and/or Al, which can be deposited onto the metal adhesion layer 1316 using a process such as CVD, ALD, PVD, sputtering, plating, evaporation, ion beam deposition, electron beam deposition, laser assisted deposition, chemical solution deposition, etc. Following deposition, the overburden can be removed using a process such as chemical mechanical polishing.

An interlayer dielectric 1300 is then deposited onto the interlayer dielectric 902 over the source/drain region contacts 1302. For clarity, the terms 'first' and 'second' may also be used herein when referring to interlayer dielectric 902 and interlayer dielectric 1300, respectively. Suitable interlayer dielectric 1300 materials include, but are not limited to, SiN, SiOC and/or oxide low-κ materials such as SiOx and/or oxide ULK-ILD materials such as pSiCOH, which can be deposited using a process such as CVD, ALD or PVD. Following deposition, the interlayer dielectric 1300 can be planarized using a process such as chemical mechanical polishing.

The source/drain region contacts 1304 and gate contacts 1306 are then formed in the interlayer dielectric 1300 over, and in direct contact with one or more of the source/drain region contacts 1302 and the replacement metal gates 1202, respectively. To form the source/drain region and gate contacts 1304 and 1306, a standard lithography and etching process (see above) is employed to pattern trenches in the interlayer dielectric 1300, which are then filled with a metal or combination of metals. Suitable metals for the source/drain region and gate contacts 1304 and 1306 include, but are not limited to, copper (Cu), W, Ru and/or Co, which can be deposited into the trenches using a process such as evaporation, sputtering, ALD, CVD or electrochemical plating. Following deposition, the metal overburden can be removed using a process such as chemical-mechanical polishing. Prior to depositing the metal(s), an adhesion layer (not shown) can be formed lining the trenches. Suitable adhesion layer materials include, but are not limited to, TiN and/or TaN. Additionally, a seed layer (not shown) can also be deposited into and lining the trenches prior to metal deposition, e.g., to facilitate plating of the metal.

Referring to FIG. 13D for example, it can be seen that those source/drain region contacts 1302 not contacting a source/drain region contact 1304 have a shape with a first (horizontal) region (region I) directly on the PFET and NFET source/drain regions 708P and 708N, and a second (vertical) region (region II) that is present alongside the PFET and NFET source/drain regions 708P and 708N. As will be described in detail below, this second/region II will serve as a via to the VDD and VSS power rails (also referred to herein as a source/drain region power via or "via to buried power rail (VBPR)"). These are the source/drain region power vias referred to above.

Back end of line interconnect layer 1308 generally includes interconnect structures commonly formed in the back end of line during semiconductor device fabrication. Namely, in the back end of line, individual devices such as transistors get interconnected through a series of metal layers. For instance, conductive structures like vias and metal lines can be employed to connect a device to one or more other devices, with the metal lines making lateral connections and the vias making vertical connections amongst different metallization levels. Standard metallization techniques can be employed to form the back end of line interconnect layer 1308. While the individual interconnects present in back end of line interconnect layer 1308 are not specifically shown in the figures, one skilled in the art would understand how such a back end of line interconnect layer 1308 is implemented for a given semiconductor device application.

Carrier wafer 1310 is then bonded to the frontside of wafer 302 over back end of line interconnect layer 1308. Suitable carrier wafers include, but are not limited to, silicon, silicon carbide and/or glass wafers. As will be described in detail below, the use a carrier wafer 1310 will enable wafer 302 to be flipped, thereby permitting the necessary backside processing for the VDD and VSS power rails and signal line.

Figure 14A:
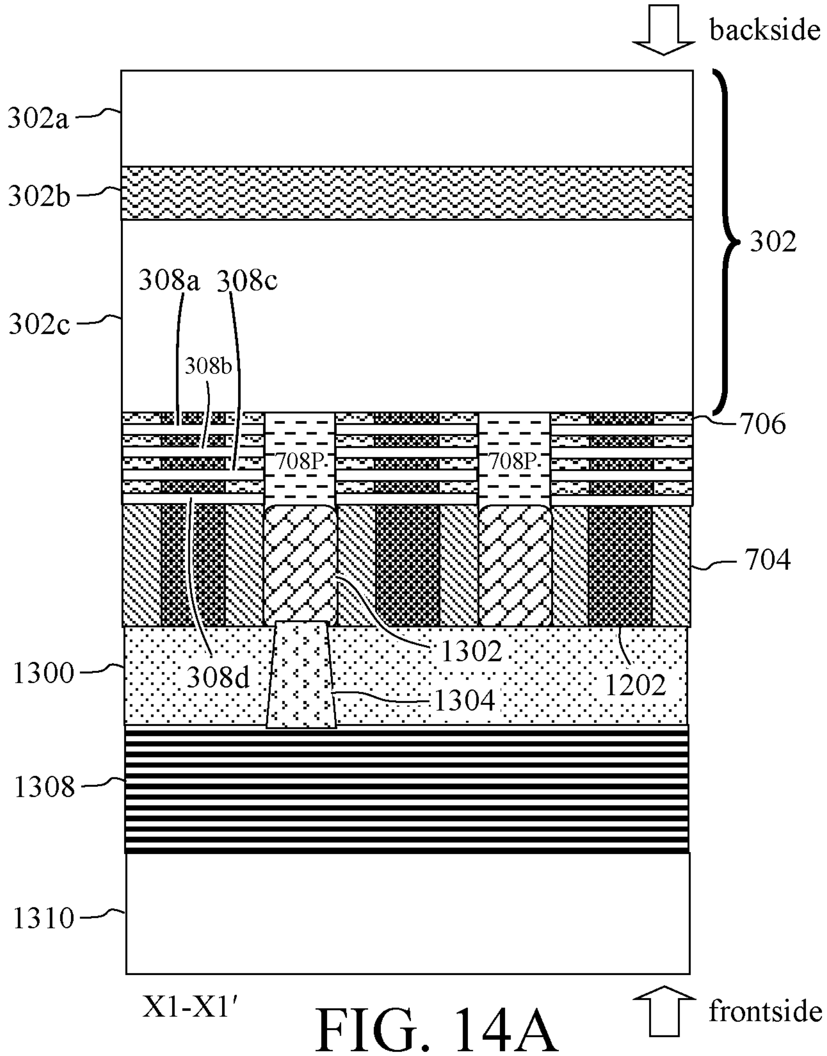
FIG. 14A is an X1-X1' cross-sectional view illustrating the wafer having been flipped.
Figure 14B:
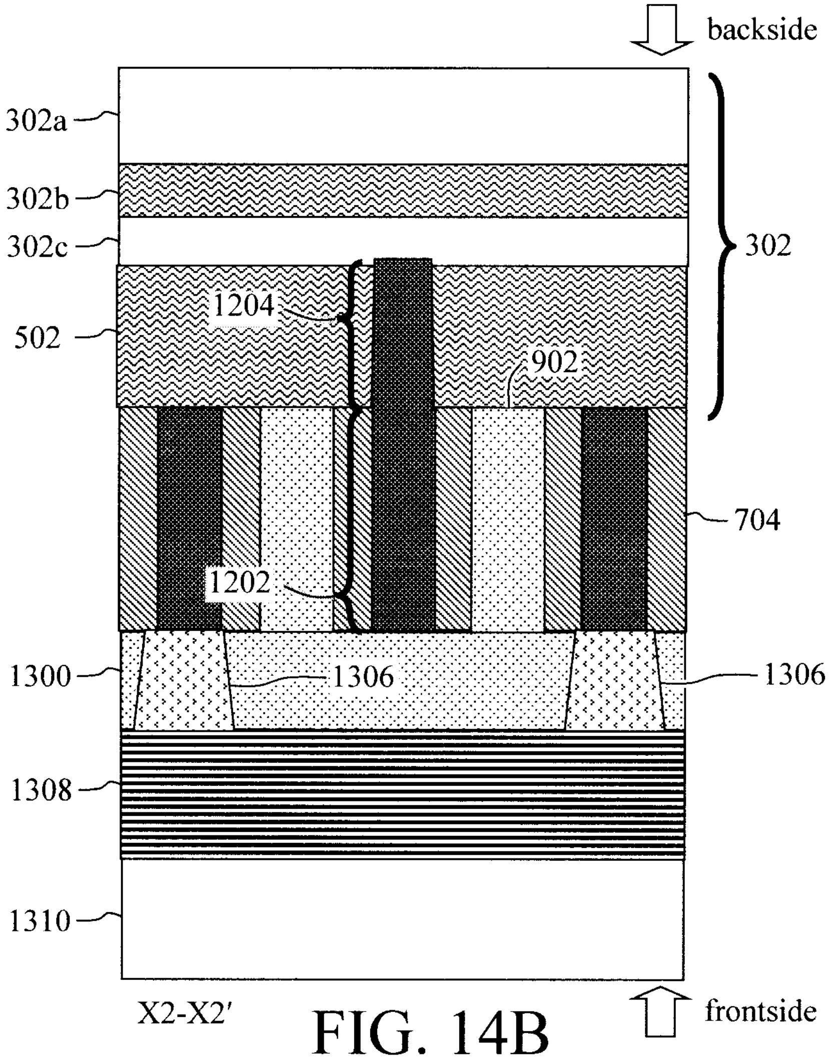
FIG. 14B is an X2-X2' cross-sectional view illustrating the wafer having been flipped.
Figure 14C:
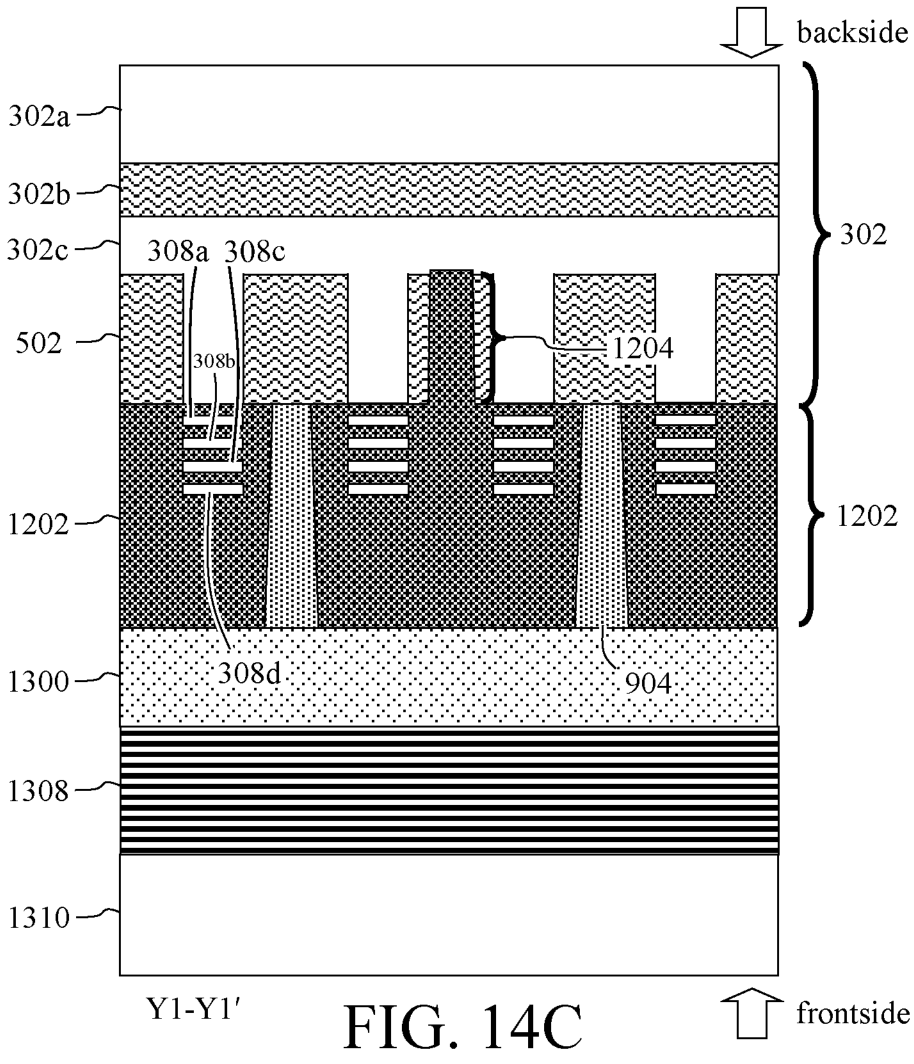
FIG. 14C is a Y1-Y1' cross-sectional view illustrating the wafer having been flipped.
Figure 14D:
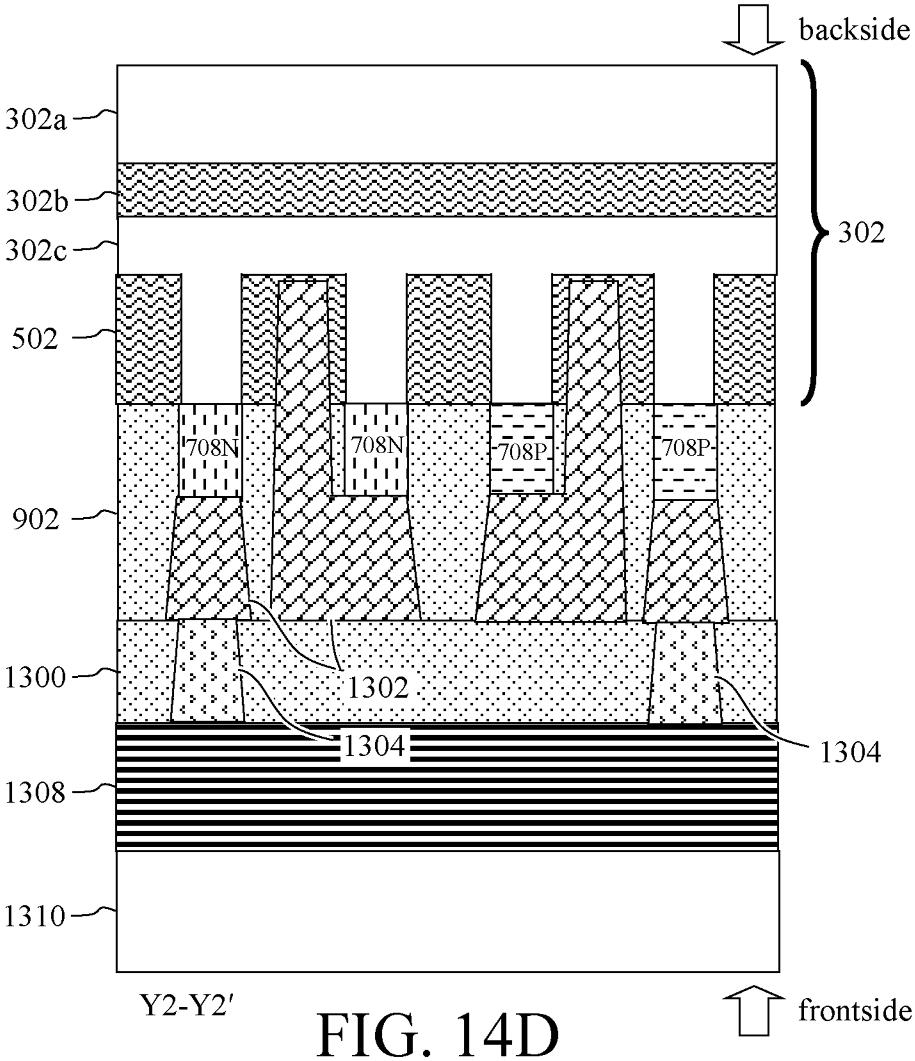
FIG. 14D is a Y2-Y2' cross-sectional view illustrating the wafer having been flipped according to an embodiment of the present invention.

Namely, as shown in FIG. 14A (an X1-X1' cross-sectional view), FIG. 14B (an X2-X2' cross-sectional view), FIG. 14C (a Y1-Y1' cross-sectional view), and FIG. 14D (a Y2-Y2' cross-sectional view), the wafer 302 is flipped. Following the flip, what was once at the bottom of wafer 302 is now on the top, and vice versa. For instance, substrate 302*a* is now the top-most layer, and carrier wafer 1310 is at the bottom. Accordingly, what has been designated the frontside and backside of the wafer 302 is now also reversed by the flip. Namely, the backside of the wafer 302 is now at the top of each figure, and the frontside of the wafer 302 is at the bottom of each figure. Following the flip, labels have been added for clarity.

Figure 15A:
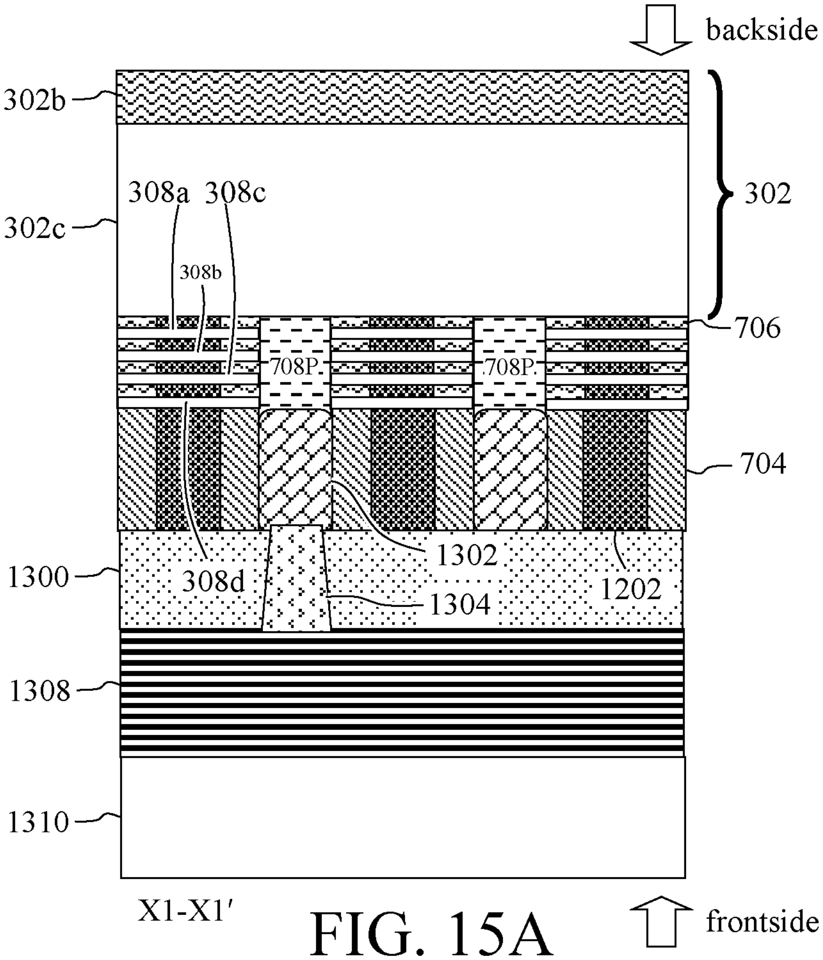
FIG. 15A is an X1-X1' cross-sectional view illustrating an etch having been performed to remove the substrate, stopping on the etch stop layer.
Figure 15B:
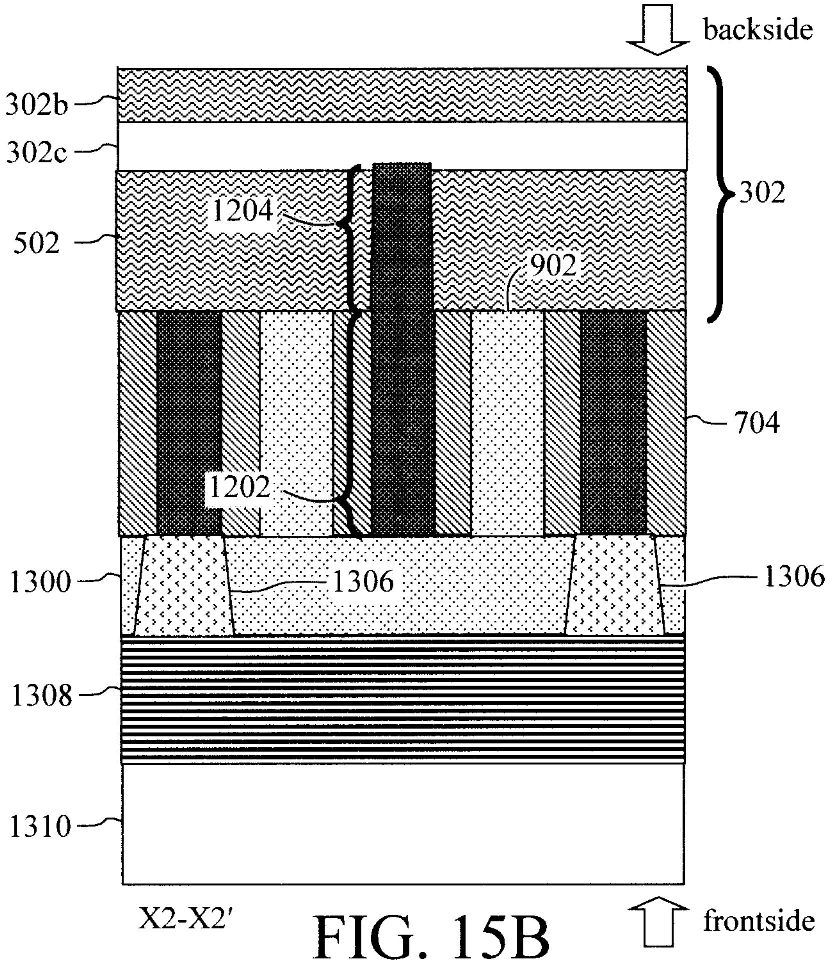
FIG. 15B is an X2-X2' cross-sectional view illustrating the etch having been performed to remove the substrate, stopping on the etch stop layer.
Figure 15C:
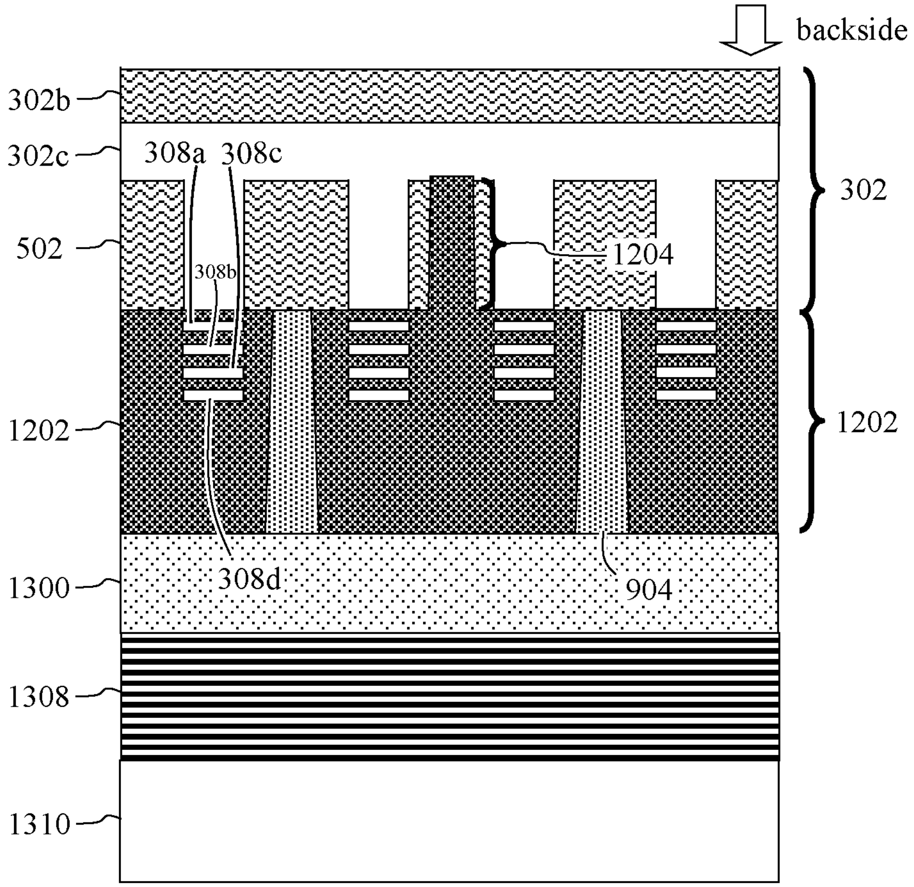
FIG. 15C is a Y1-Y1' cross-sectional view illustrating the etch having been performed to remove the substrate, stopping on the etch stop layer.
Figure 15D:
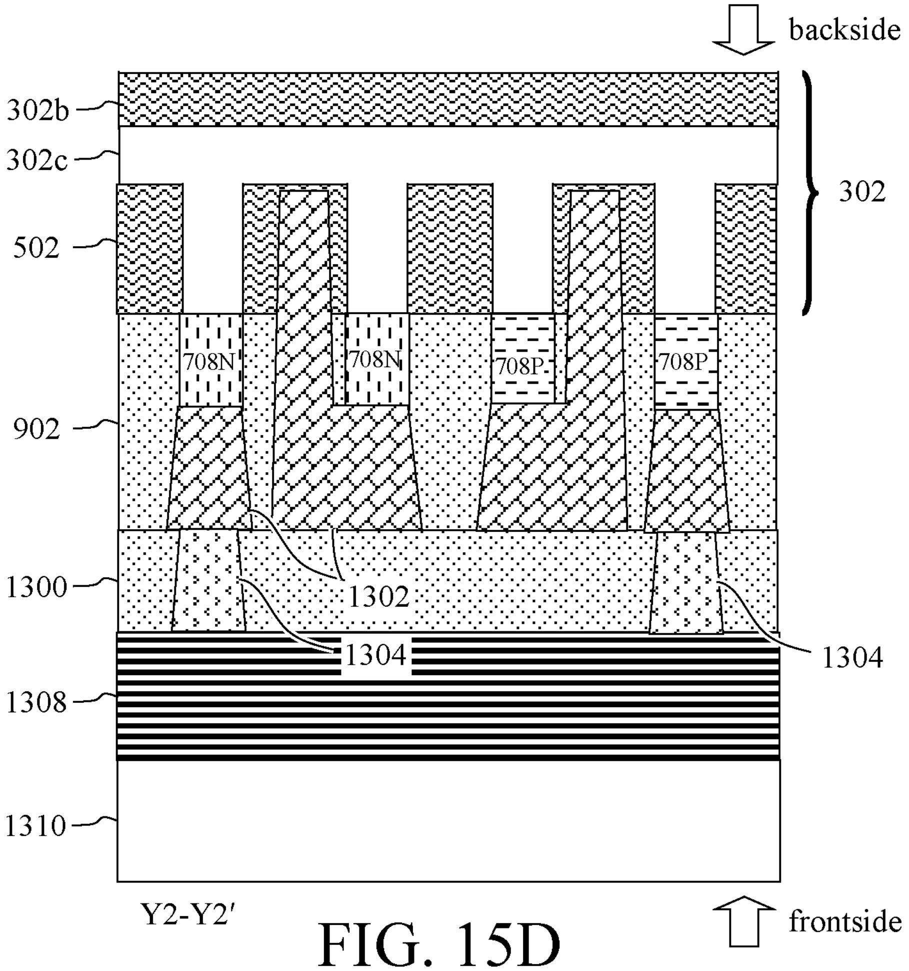
FIG. 15D is a Y2-Y2' cross-sectional view illustrating the etch having been performed to remove the substrate, stopping on the etch stop layer according to an embodiment of the present invention.
Figure 16A:
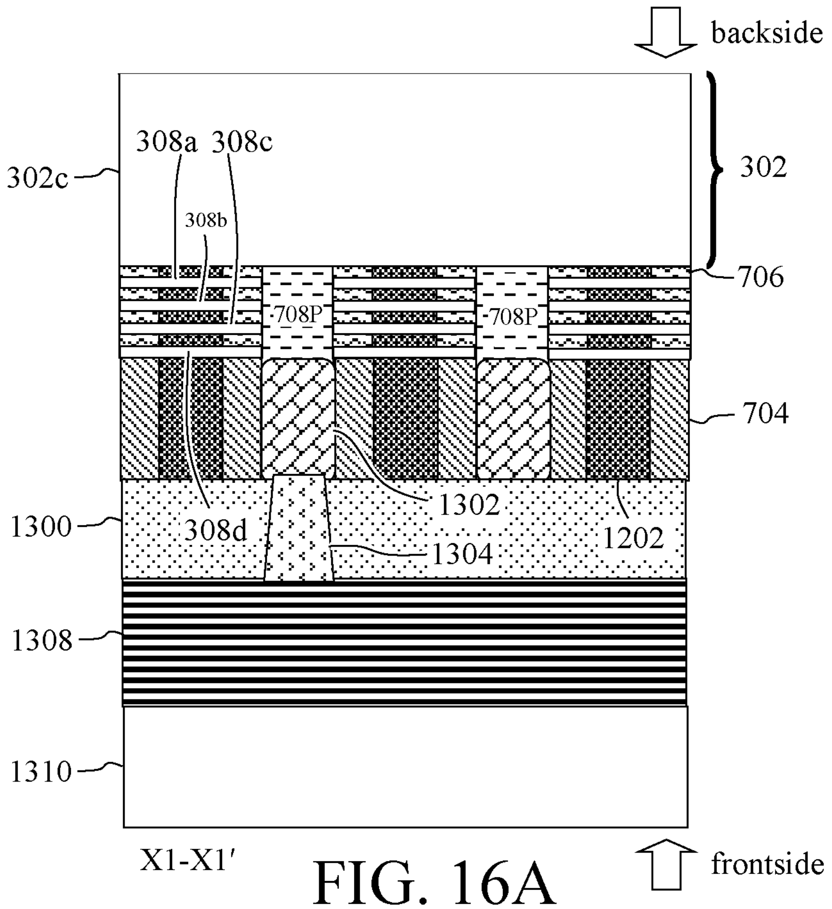
FIG. 16A is an X1-X1' cross-sectional view illustrating the etch stop layer having been removed.
Figure 16B:
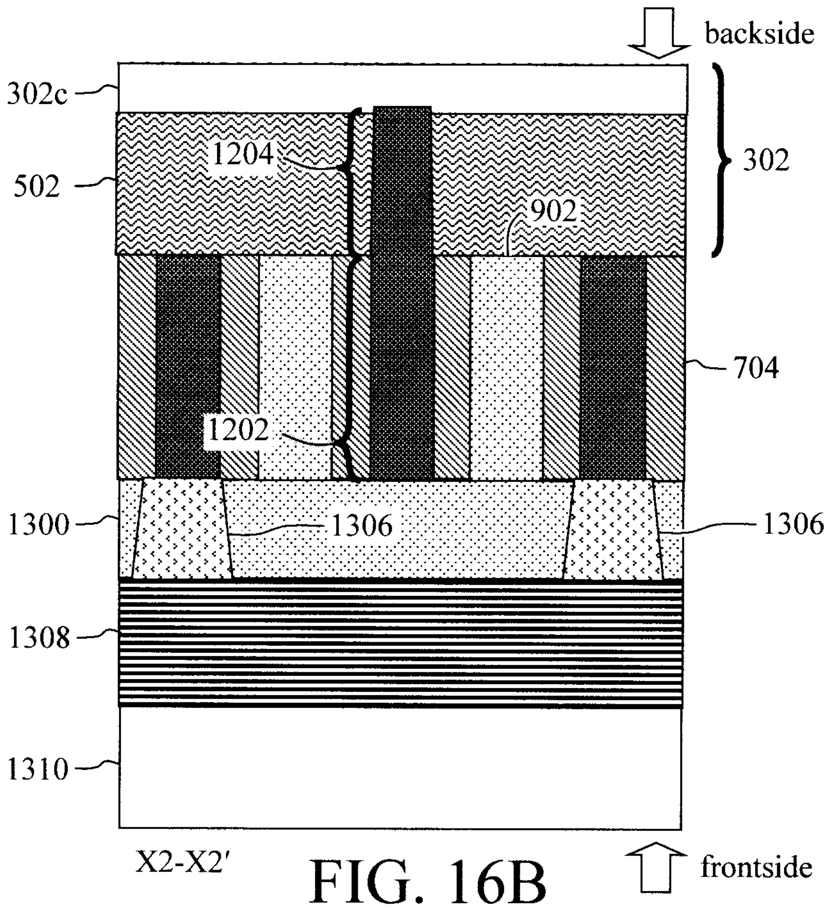
FIG. 16B is an X2-X2' cross-sectional view illustrating the etch stop layer having been removed.
Figure 16C:
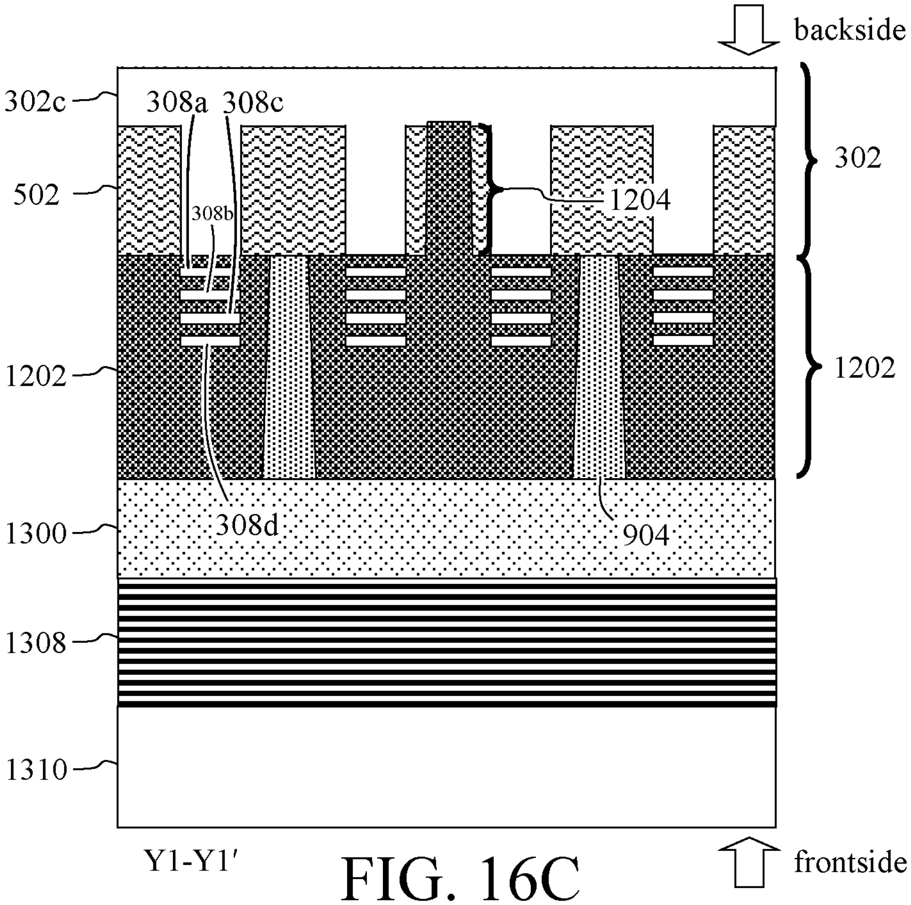
FIG. 16C is a Y1-Y1' cross-sectional view illustrating the etch stop layer having been removed.
Figure 16D:
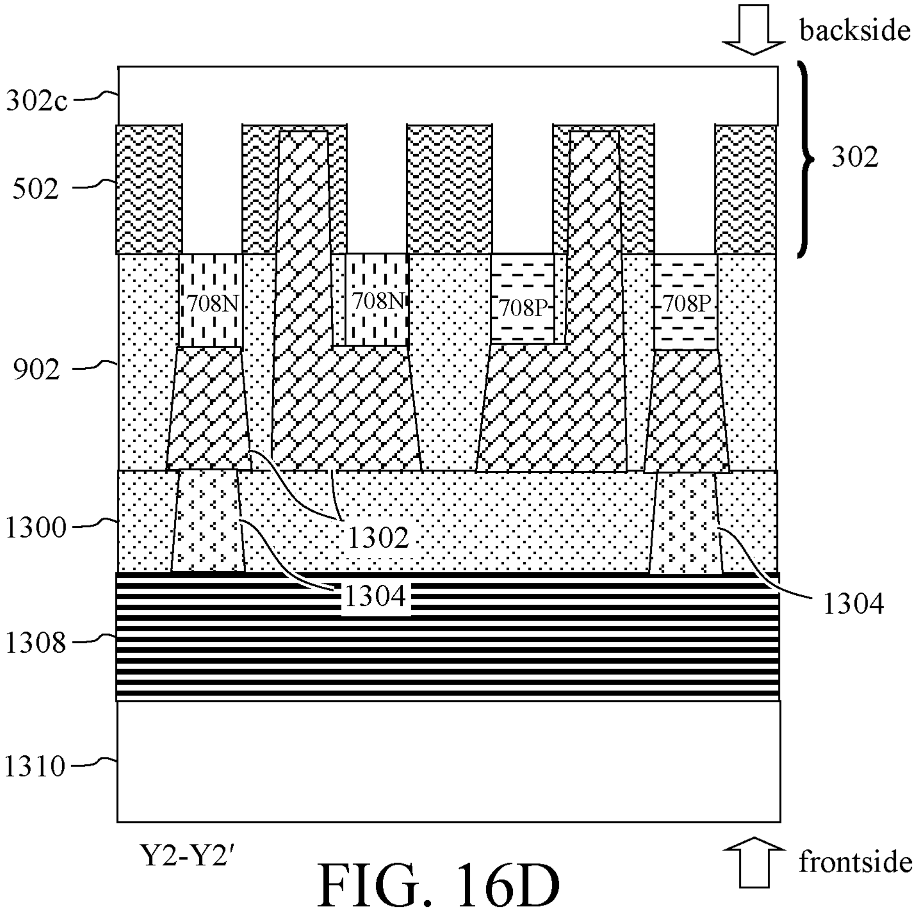
FIG. 16D is a Y2-Y2' cross-sectional view illustrating the etch stop layer having been removed according to an embodiment of the present invention.

As shown in FIG. 15A (an X1-X1' cross-sectional view), FIG. 15B (an X2-X2' cross-sectional view), FIG. 15C (a Y1-Y1' cross-sectional view), and FIG. 15D (a Y2-Y2' cross-sectional view), an etch is next performed to remove the substrate 302*a*, stopping on the etch stop layer 302*b*. As provided above, etch stop layer 302*b* can be formed from SiGe or an oxide material, and the substrate 302*a* can be formed from Si. In that case, an Si-selective etch can be used to remove the substrate 302*a*. Another, e.g., SiGe or oxide-selective, etch can then be performed in turn to remove the etch stop layer 302*b*. See FIG. 16A (an X1-X1' cross-sectional view), FIG. 16B (an X2-X2' cross-sectional view), FIG. 16C (a Y1-Y1' cross-sectional view), and FIG. 16D (a Y2-Y2' cross-sectional view).

Figure 17A:
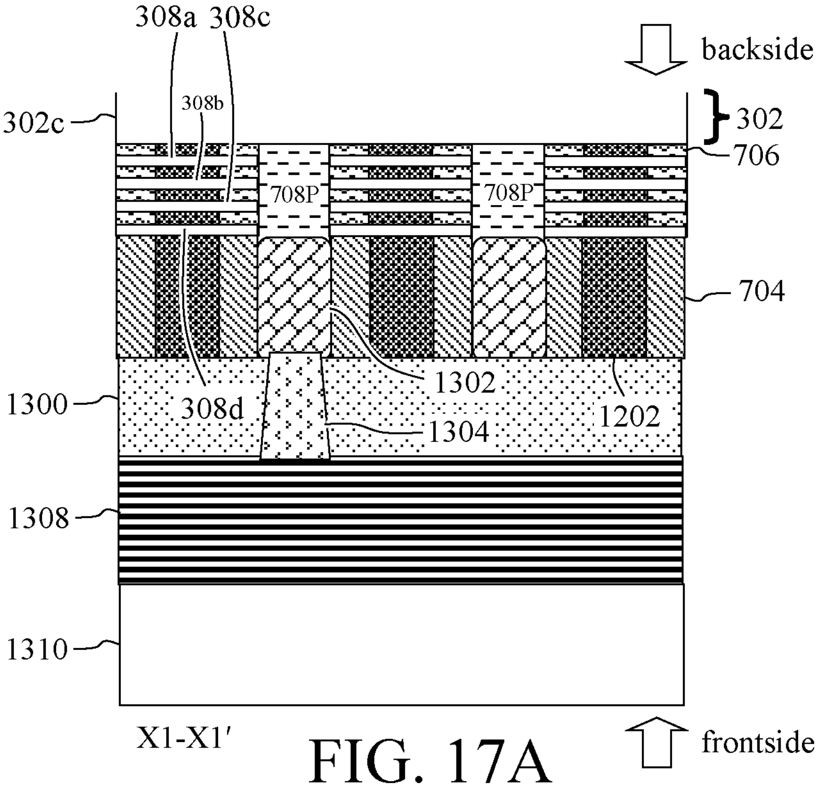
FIG. 17A is an X1-X1' cross-sectional view illustrating the semiconductor layer having been recessed.
Figure 17B:
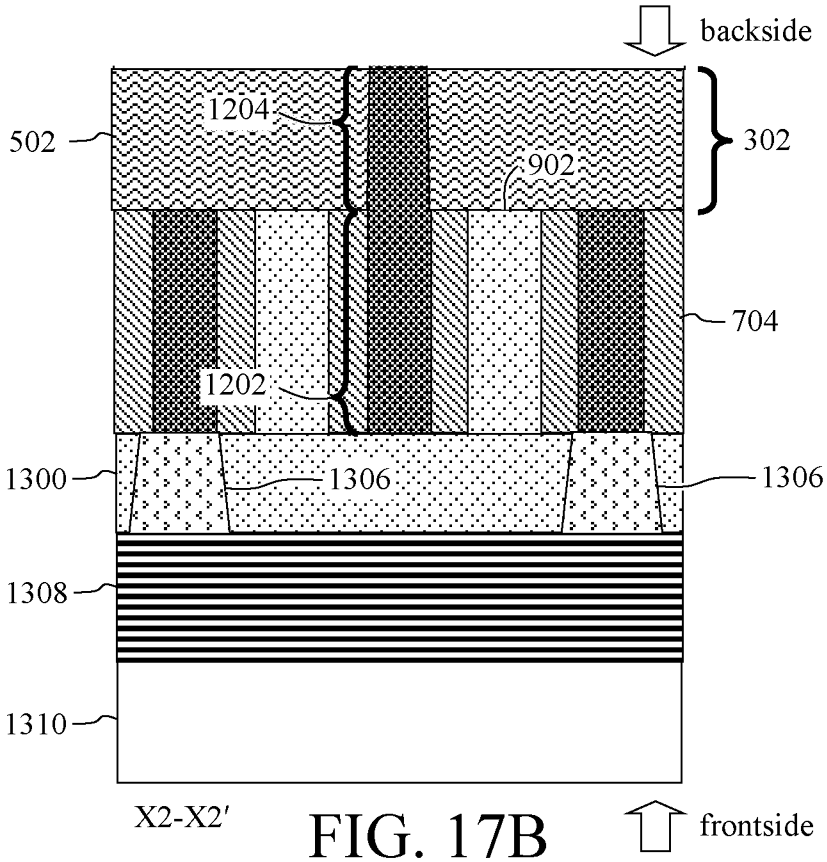
FIG. 17B is an X2-X2' cross-sectional view illustrating the semiconductor layer having been recessed to expose the signal line contact.
Figure 17C:
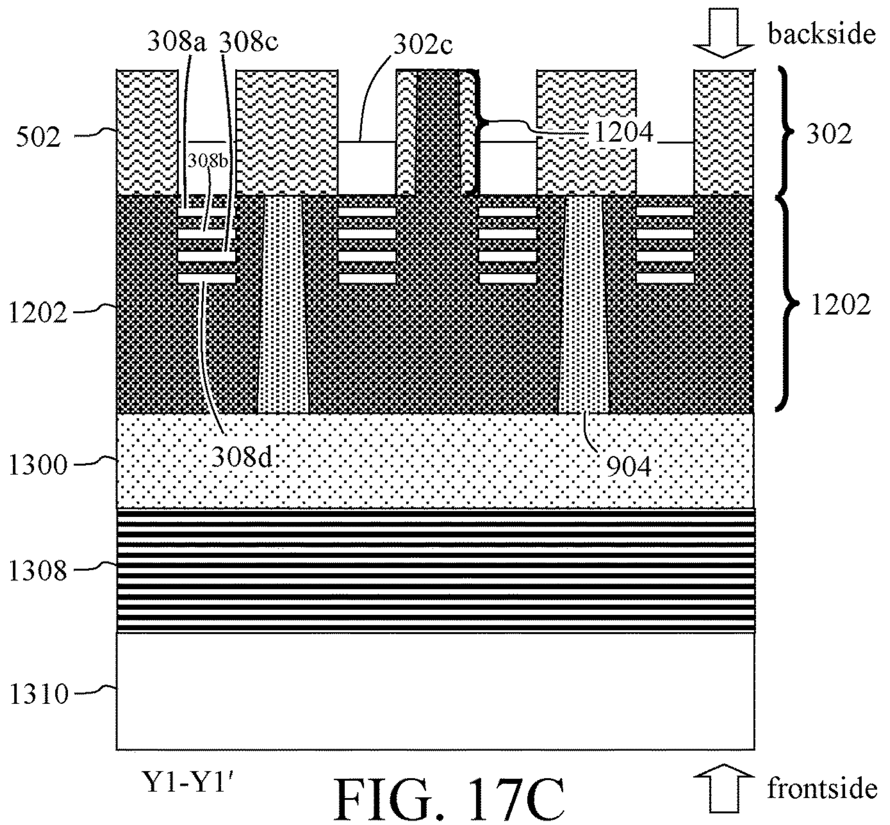
FIG. 17C is a Y1-Y1' cross-sectional view illustrating the semiconductor layer having been recessed to expose the signal line contact.
Figure 17D:
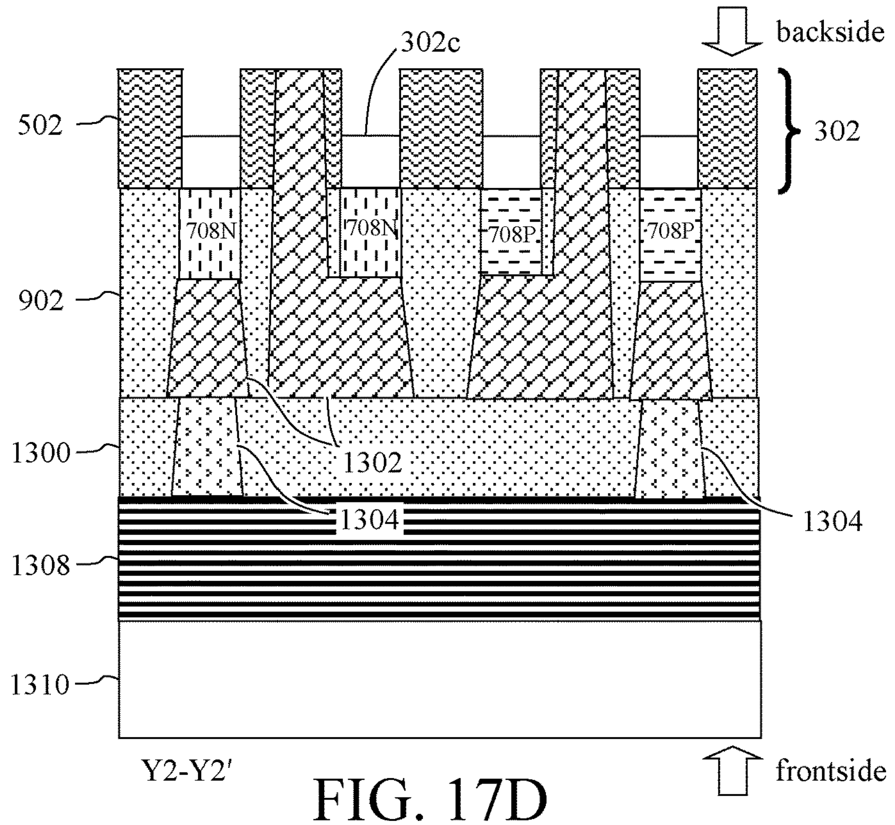
FIG. 17D is a Y2-Y2' cross-sectional view illustrating the semiconductor layer having been recessed to expose the signal line contact and a backside of the source/drain region contacts according to an embodiment of the present invention.

As shown in FIG. 17A (an X1-X1' cross-sectional view), FIG. 17B (an X2-X2' cross-sectional view), FIG. 17C (a Y1-Y1' cross-sectional view), and FIG. 17D (a Y2-Y2' cross-sectional view), a recess of the semiconductor layer 302*c* is next performed in order to expose the signal line contact 1204 and source/drain region contacts 1302 (VBPR) on the backside of the wafer 302. As provided above, the semiconductor layer 302*c* can be formed from Si. In that case, an Si-selective etch can be employed to recess the semiconductor layer 302*c*. According to the example depicted in the figures, the semiconductor layer 302*c* is recessed below shallow trench isolation regions 502, i.e., a top surface of the semiconductor layer 302*c* is now present below a top surface of the shallow trench isolation regions 502.

Figure 18A:
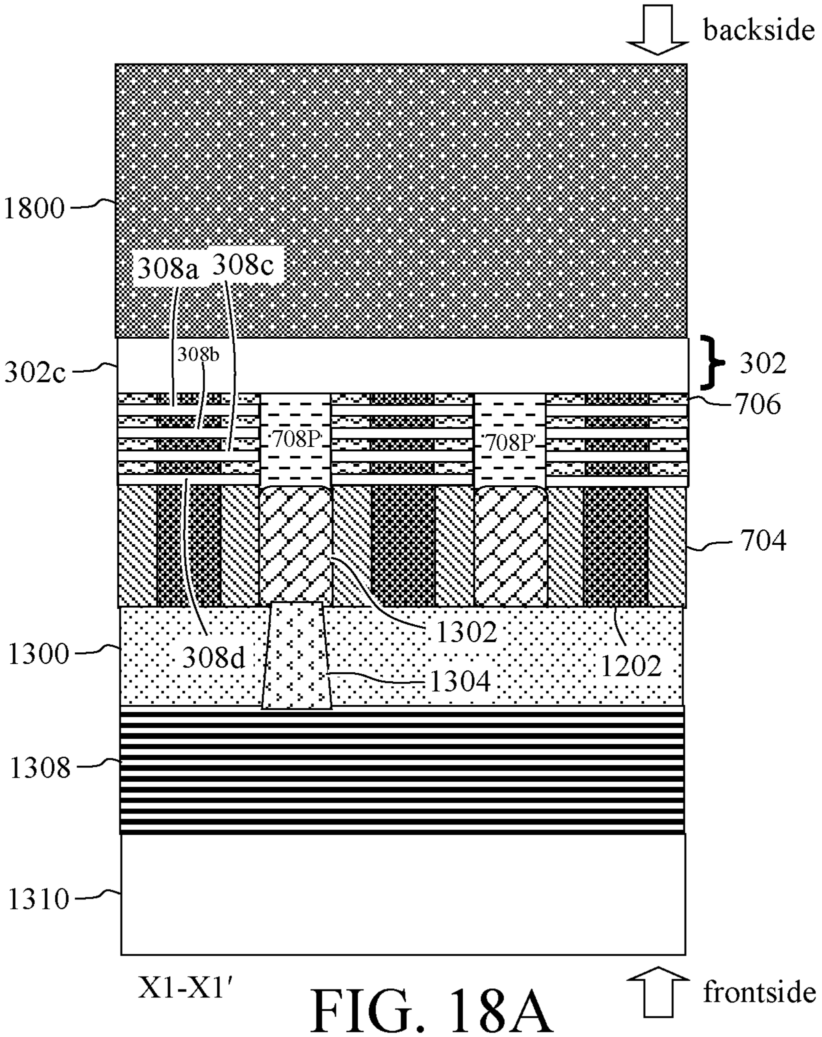
FIG. 18A is an X1-X1' cross-sectional view illustrating a backside interlayer dielectric having been deposited onto the recessed semiconductor layer.
Figure 18B:
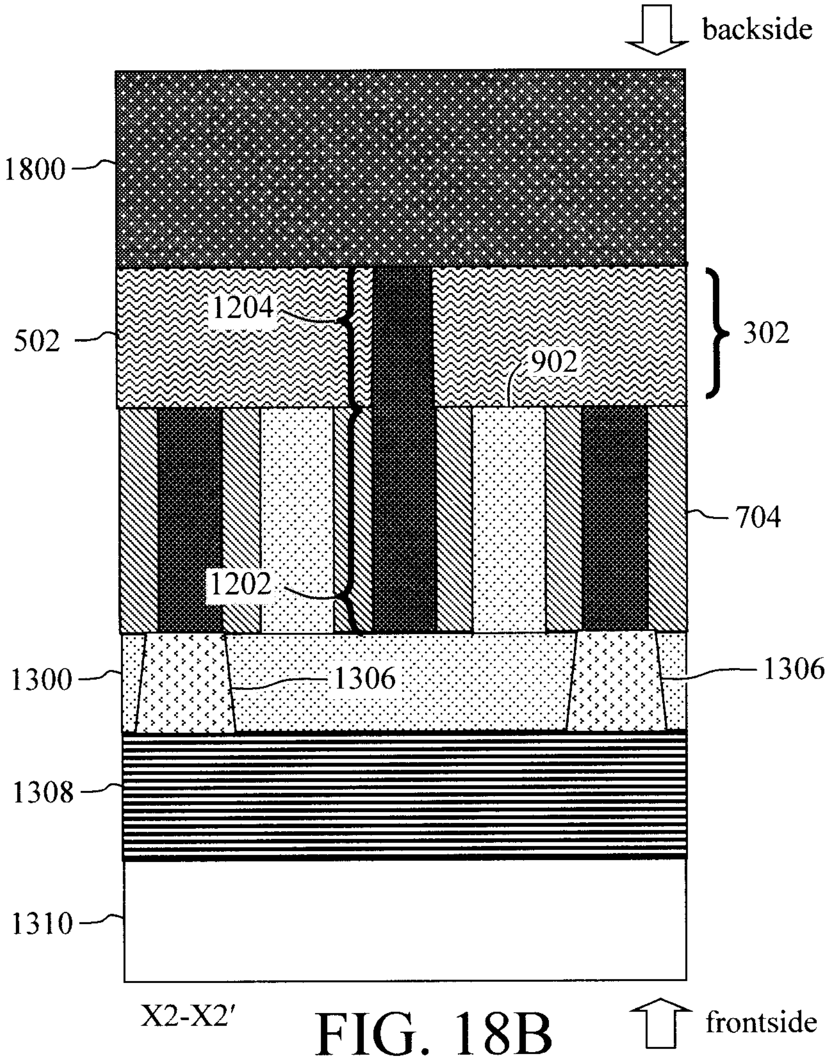
FIG. 18B is an X2-X2' cross-sectional view illustrating the backside interlayer dielectric having been deposited onto the trench isolation regions over the signal line contact.
Figure 18C:
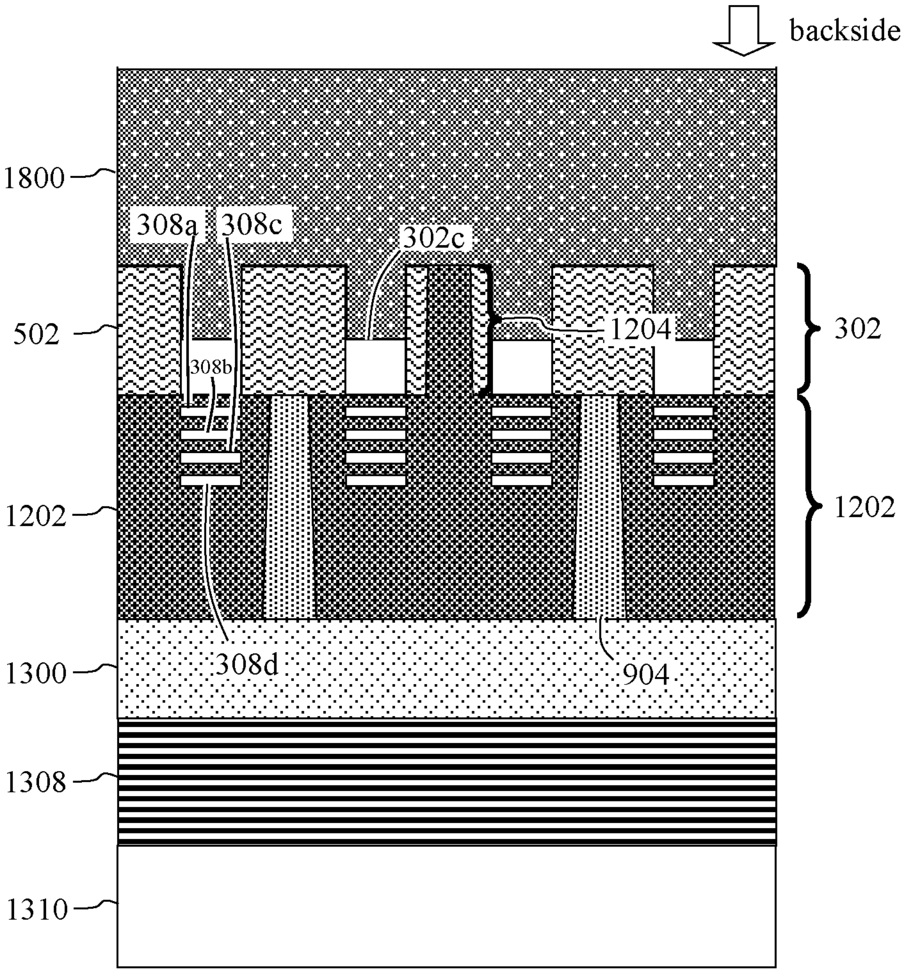
FIG. 18C is a Y1-Y1' cross-sectional view illustrating the backside interlayer dielectric having been deposited onto the recessed semiconductor layer and trench isolation regions over the signal line contact.
Figure 18D:
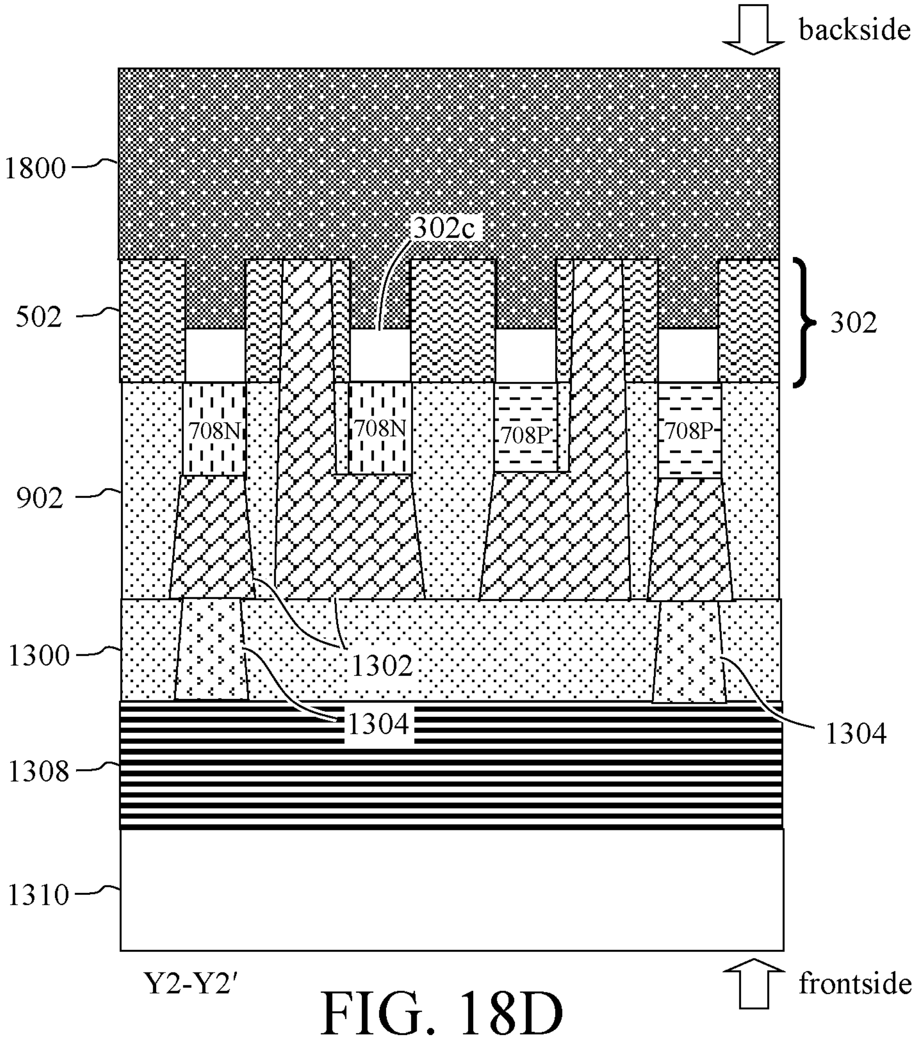
FIG. 18D is a Y2-Y2' cross-sectional view illustrating the backside interlayer dielectric having been deposited onto the recessed semiconductor layer and trench isolation regions over the signal line contact and the source/drain region contacts according to an embodiment of the present invention.

As shown in FIG. 18A (an X1-X1' cross-sectional view), FIG. 18B (an X2-X2' cross-sectional view), FIG. 18C (a Y1-Y1' cross-sectional view), and FIG. 18D (a Y2-Y2' cross-sectional view), a (backside) interlayer dielectric 1800 is then deposited onto the (recessed) semiconductor layer 302*c* and trench isolation regions 502 over the signal line contact 1204 and source/drain region contacts 1302. For clarity, the term 'third' may also be used herein when referring to interlayer dielectric 1800 so as to distinguish it from the 'first' interlayer dielectric 902 and the 'second' interlayer dielectric 1300. Suitable interlayer dielectric 1800 materials include, but are not limited to, SiN, SiOC and/or oxide low-κ materials such as SiOx and/or oxide ULK-ILD materials such as pSiCOH, which can be deposited using a process such as CVD, ALD or PVD. Following deposition, the interlayer dielectric 1800 can be planarized using a process such as chemical mechanical polishing.

Figure 19A:
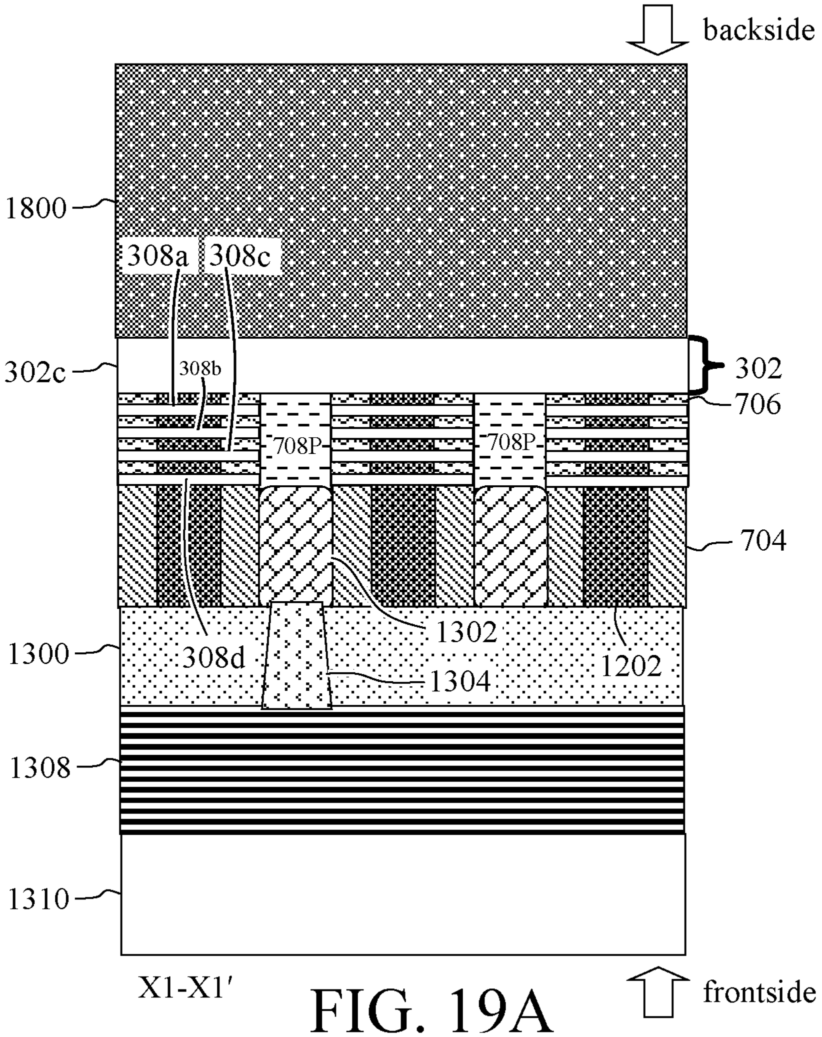
FIG. 19A is an X1-X1' cross-sectional view illustrating VDD and VSS power rails, and signal line having been formed in the backside interlayer dielectric.
Figure 19B:
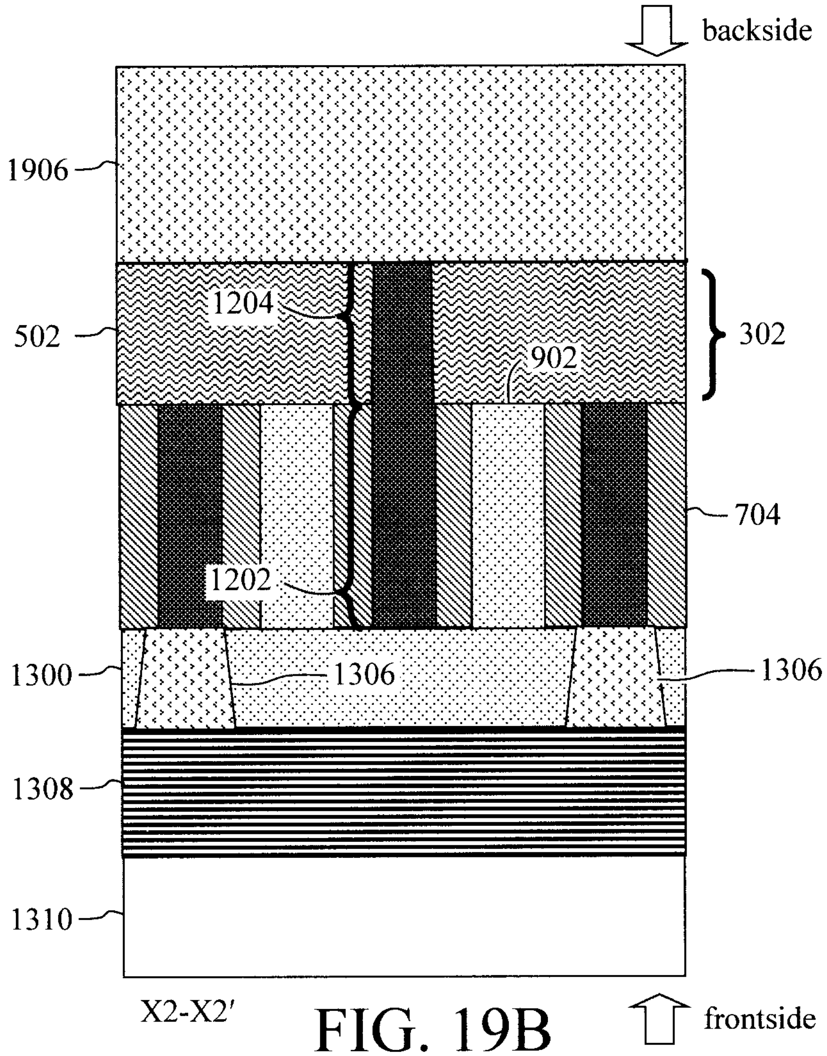
FIG. 19B is an X2-X2' cross-sectional view illustrating the signal line having been formed in the backside interlayer dielectric.
Figure 19C:
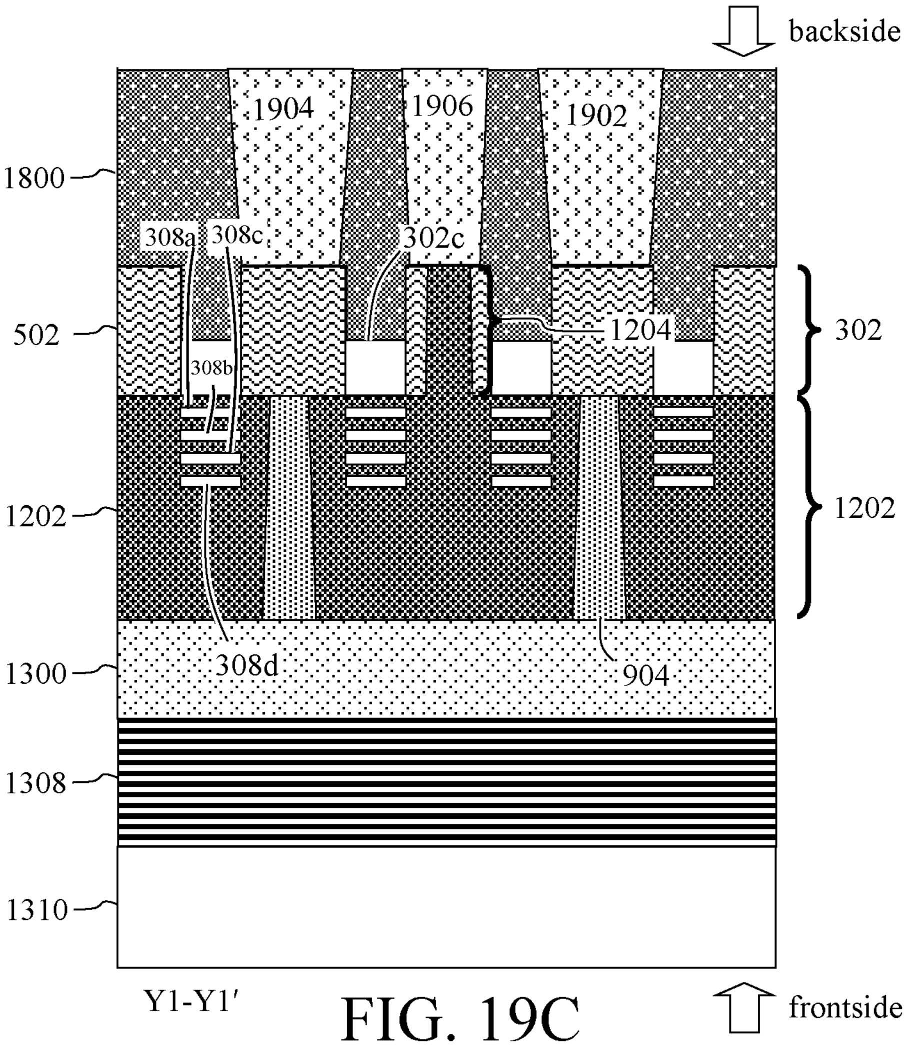
FIG. 19C is a Y1-Y1' cross-sectional view illustrating the VDD/VSS power rails and the signal line having been formed in the backside interlayer dielectric.
Figure 19D:
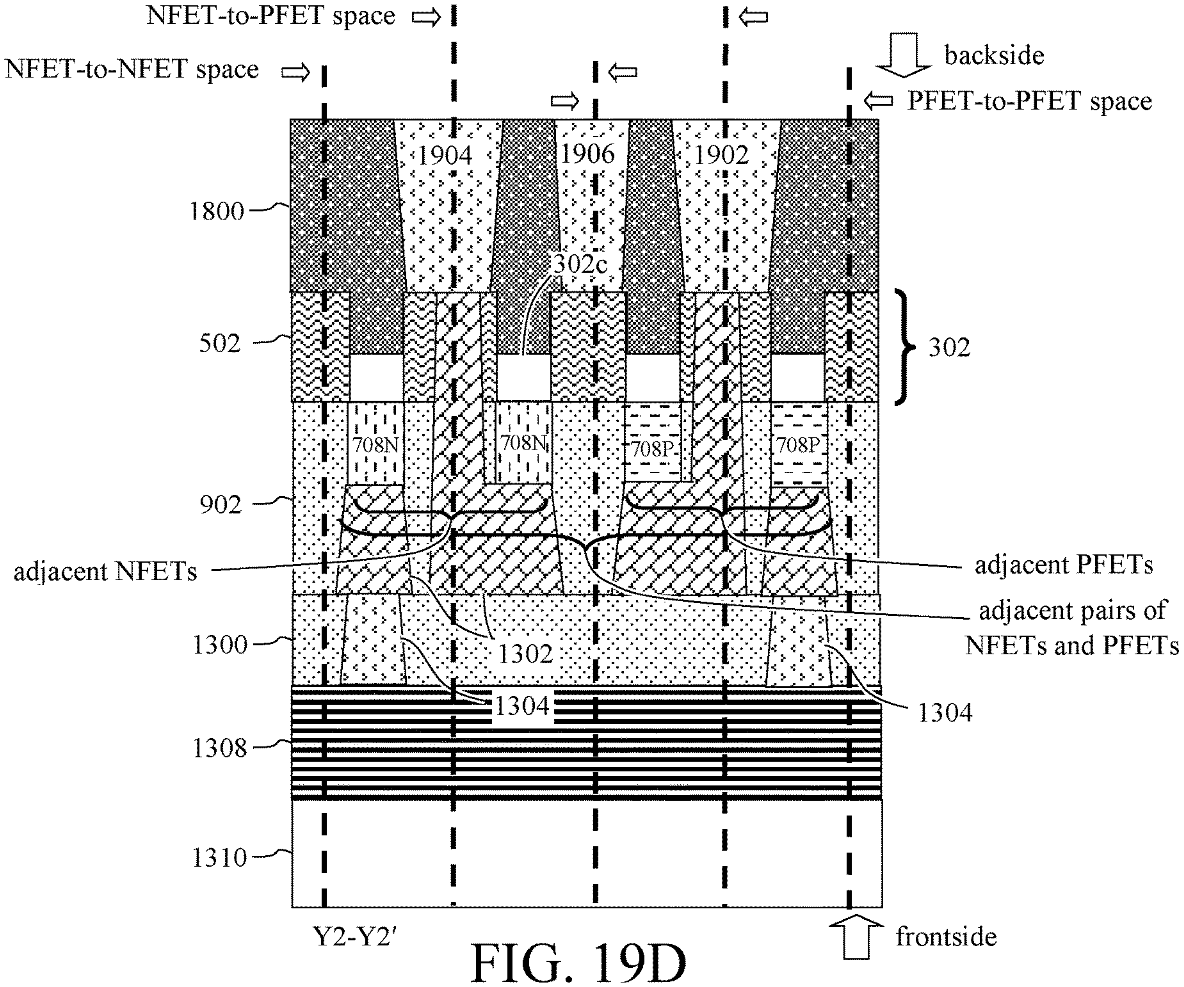
FIG. 19D is a Y2-Y2' cross-sectional view illustrating the VDD/VSS power rails and the signal line having been formed in the backside interlayer dielectric according to an embodiment of the present invention.

As shown in FIG. 19A (an X1-X1' cross-sectional view), FIG. 19B (an X2-X2' cross-sectional view), FIG. 19C (a Y1-Y1' cross-sectional view), and FIG. 19D (a Y2-Y2' cross-sectional view), VDD and VSS power rails 1902 and 1904, respectively, and signal line 1906 are then formed in the interlayer dielectric 1800 on the backside of the wafer 302 in the PFET-to-PFET space (VDD power rail 1902) and NFET-to-NFET space (VSS power rail 1904), and in the NFET-to-PFET space (signal line 1906).

To form the VDD and VSS power rails 1902 and 1904, and the signal line 1906, a standard lithography and etching process (see above) is employed to pattern trenches in the interlayer dielectric 1800, which are then filled with a metal or combination of metals. Suitable metals for the VDD and VSS power rails 1902 and 1904, and the signal line 1906 include, but are not limited to, Cu, W, Ru and/or Co, which can be deposited into the trenches using a process such as evaporation, sputtering, ALD, CVD or electrochemical plating. Following deposition, the metal overburden can be removed using a process such as chemical-mechanical polishing. Prior to depositing the metal(s), an adhesion layer (not shown) can be formed lining the trenches. As provided above, suitable adhesion layer materials include, but are not limited to, TiN and/or TaN. Additionally, a seed layer (not shown) can also be deposited into and lining the trenches prior to metal deposition, e.g., to facilitate plating of the metal.

Reference is made throughout to the NFET-to-NFET space, PFET-to-PFET space, and NFET-to-PFET space, in which the VSS power rail 1904, VDD power rail 1902, and a signal line 1906, respectively, are placed. As should be apparent from the description above, the NFET-to-NFET space, PFET-to-PFET space, and NFET-to-PFET space are the regions on the frontside of the wafer 302 and on the backside of the wafer 302 (opposite the corresponding regions on the frontside of the wafer 302) between adjacent NFET transistors, between adjacent PFET transistors and between adjacent pairs of NFET and PFET transistors. For clarity, these regions are shown illustrated in FIG. 19D.

Figure 20A:
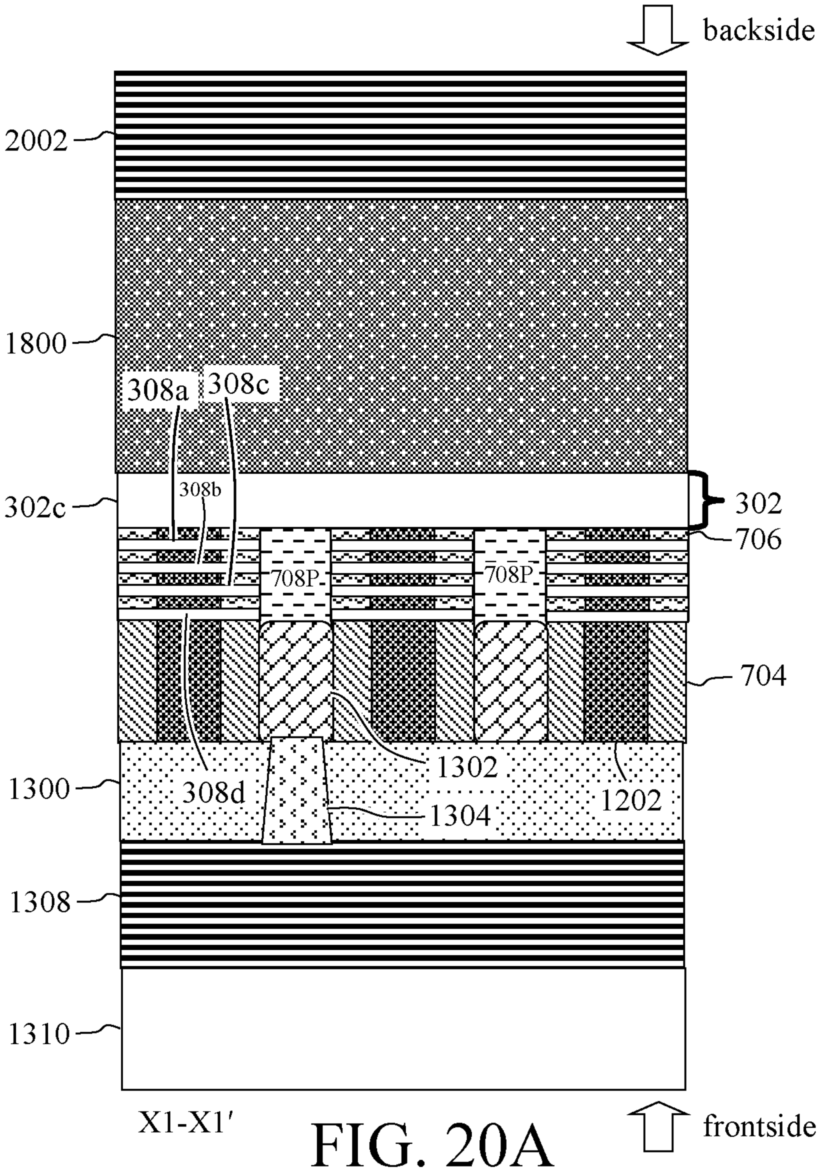
FIG. 20A is an X1-X1' cross-sectional view illustrating a backside power delivery network having been formed on the backside interlayer dielectric.
Figure 20B:
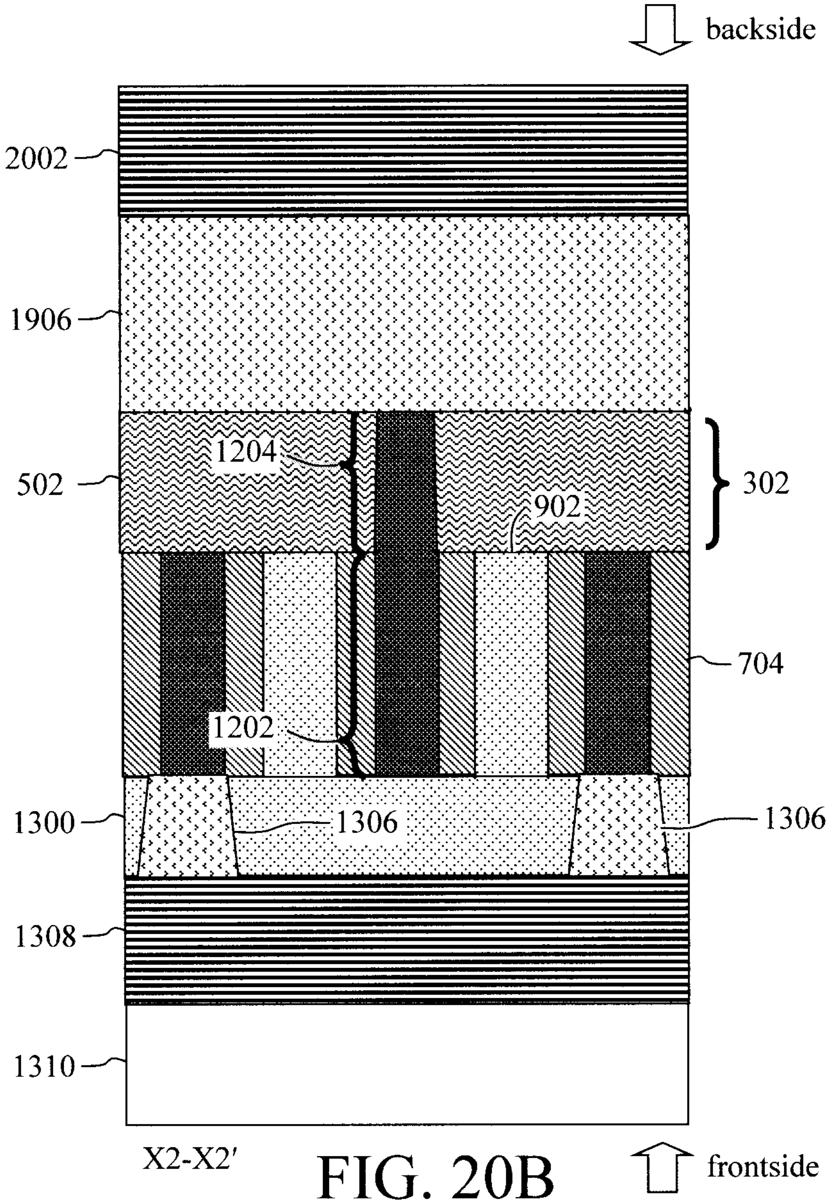
FIG. 20B is an X2-X2' cross-sectional view illustrating the backside power delivery network having been formed on the backside interlayer dielectric.
Figure 20C:
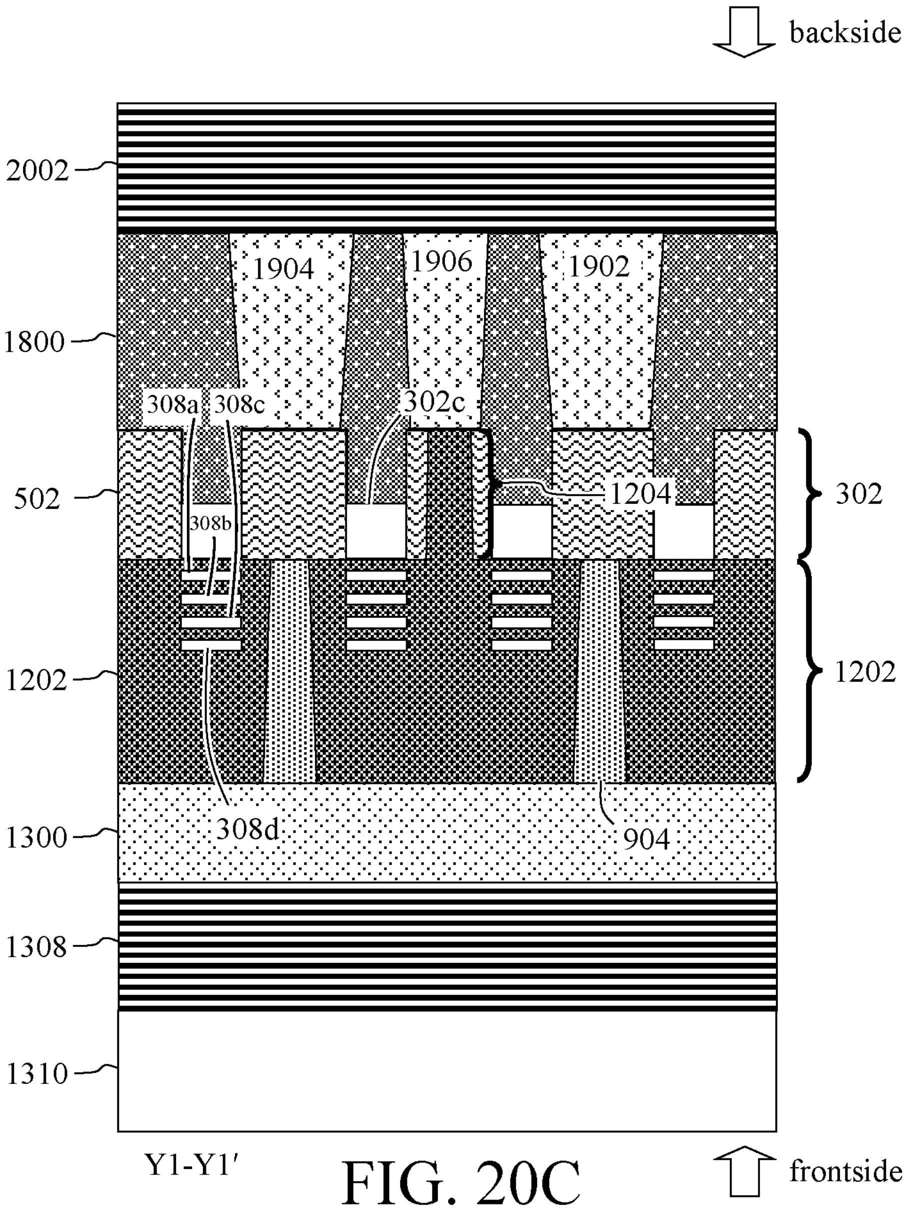
FIG. 20C is a Y1-Y1' cross-sectional view illustrating the backside power delivery network having been formed on the backside interlayer dielectric.
Figure 20D:
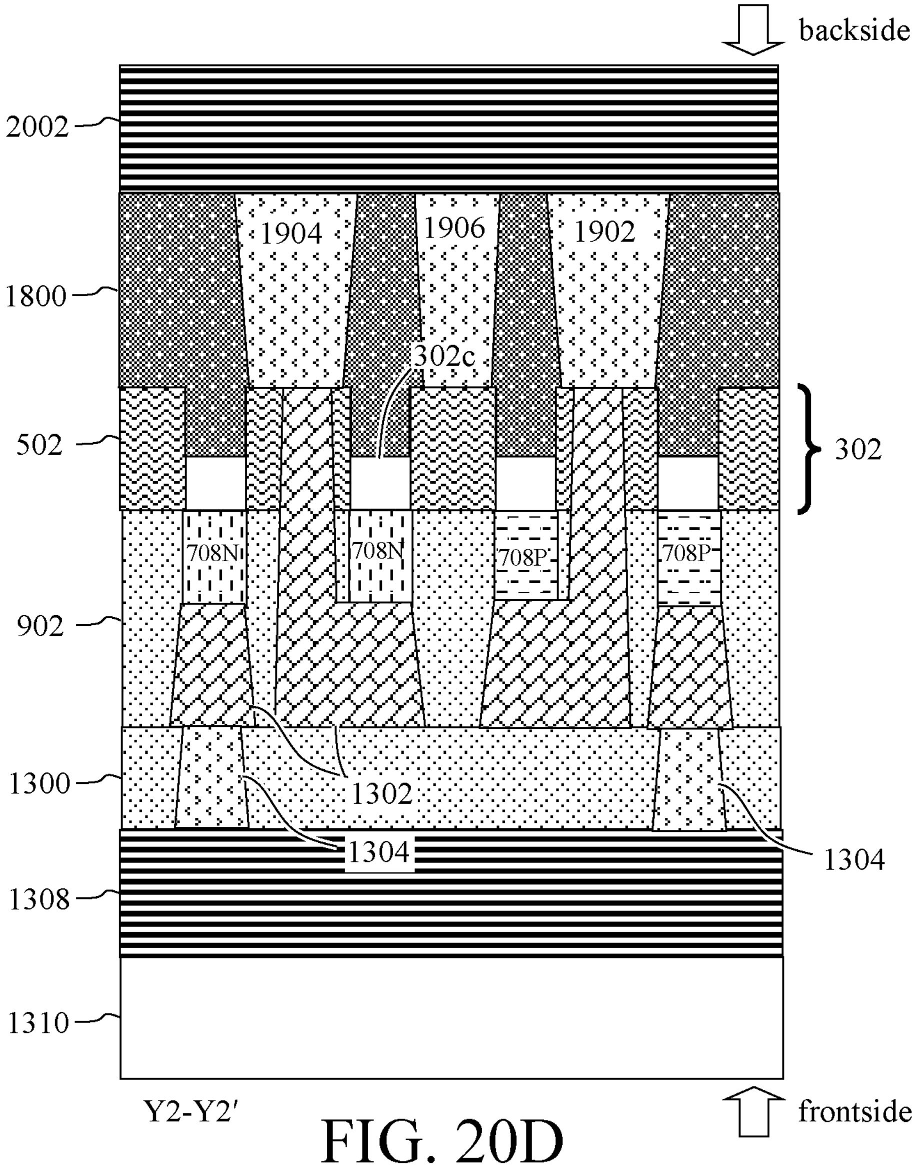
FIG. 20D is a Y2-Y2' cross-sectional view illustrating the backside power delivery network having been formed on the backside interlayer dielectric according to an embodiment of the present invention.

Finally, as shown in FIG. 20A (an X1-X1' cross-sectional view), FIG. 20B (an X2-X2' cross-sectional view), FIG. 20C (a Y1-Y1' cross-sectional view), and FIG. 20D (a Y2-Y2' cross-sectional view), a backside power delivery network 2002 is formed on the interlayer dielectric 1800 on the backside of the wafer 302 over the VDD power rail 1902, the VSS power rail 1904, and the signal line 1906.

Backside power delivery network 2002 generally includes backside interconnect structures such as conductive vias and metal lines commonly formed to interconnect the various devices (in this case the VDD power rail 1902, the VSS power rail 1904 and/or the signal line 1906), with the metal lines making lateral connections and the vias making vertical connections amongst different metallization levels. Standard metallization techniques can be employed to form the backside power delivery network 2002. While the individual interconnects present in backside power delivery network 2002 are not specifically shown in the figures, one skilled in the art would understand how such a backside power delivery network 2002 is implemented for a given semiconductor device application.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor device, comprising:

n-channel field-effect transistors (NFETs) and p-channel field-effect transistors (PFETs) adjacent to one another on a frontside of a wafer;

power rails, connected to source/drain regions of the NFETs and the PFETs, present on a backside of the wafer in a space between adjacent NFETs and in a space between adjacent PFETs;

a signal line, connected to a gate of the NFETs and the PFETs, present on the backside of the wafer in a space between an adjacent NFET and PFET; and a signal line contact connecting the one of the gates to the signal line, wherein the signal line contact and the gate are integrally formed.

2. The semiconductor device of claim 1, wherein the gate and the signal line contact share common sidewalls.

3. The semiconductor device of claim 1, wherein the gate and the signal line contact comprise a same combination of materials.

4. The semiconductor device of claim 3, wherein the gate and the signal line contact each comprises:

a gate dielectric;

at least one workfunction-setting metal disposed on the gate dielectric; and a fill metal disposed on the at least one workfunction-setting metal.

5. The semiconductor device of claim 4, wherein the gate dielectric comprises a high-K material.

6. The semiconductor device of claim 1, further comprising:

source/drain region power vias connecting the source/drain regions to the power rails.

7. The semiconductor device of claim 6, wherein one or more of the source/drain region power vias comprise:

a first region directly on the source/drain regions; and a second region present alongside the source/drain regions.

8. The semiconductor device of claim 1, wherein the power rails and the signal line are parallel to one another on the backside of the wafer.

9. The semiconductor device of claim 1, wherein the NFETs are adjacent to one another on the frontside of the wafer, wherein the PFETs are adjacent to one another on the frontside of the wafer, and wherein a pair of the NFETs is adjacent to a pair of the PFETs on the frontside of the wafer.

10. A semiconductor device, comprising:

n-channel field-effect transistors (NFETs) and p-channel field-effect transistors (PFETs) adjacent to one another on a frontside of a wafer, wherein the NFETs and the PFETs each includes a stack of active layers interconnecting source/drain regions, and gates surrounding at least a portion of each of the active layers in a gate-all-around configuration;

power rails, connected to the source/drain regions, present on a backside of the wafer in a space between adjacent NFETs and in a space between adjacent PFETs;

a signal line, connected to a given one of the gates, present on the backside of the wafer in a space between an adjacent NFET and PFET; and a signal line contact connecting the one of the gates to the signal line, wherein the signal line contact and the gate are integrally formed.

11. The semiconductor device of claim 10, wherein the given gate and the signal line contact share common sidewalls.

12. The semiconductor device of claim 10, wherein the gates and the signal line contact comprise a same combination of materials.

13. The semiconductor device of claim 12, wherein the gates and the signal line contact each comprises:

a gate dielectric;

at least one workfunction-setting metal disposed on the gate dielectric; and a fill metal disposed on the at least one workfunction-setting metal.

14. The semiconductor device of claim 13, wherein the gate dielectric comprises a high-K material.

15. The semiconductor device of claim 10, further comprising:

source/drain region power vias connecting the source/drain regions to the power rails.

* * * * *